United States Patent
Bang

(10) Patent No.: US 7,229,542 B2
(45) Date of Patent: Jun. 12, 2007

(54) METHODS OF AND APPARATUS FOR MOLDING STRUCTURES USING SACRIFICIAL METAL PATTERNS

(75) Inventor: Christopher A. Bang, San Diego, CA (US)

(73) Assignee: Microfabrica Inc., Van Nuys, CA (US)

( * ) Notice: Subject to any disclaimer, the term of this patent is extended or adjusted under 35 U.S.C. 154(b) by 48 days.

(21) Appl. No.: 10/434,315

(22) Filed: May 7, 2003

(65) Prior Publication Data

US 2003/0234179 A1 Dec. 25, 2003

Related U.S. Application Data

(60) Provisional application No. 60/379,135, filed on May 7, 2002.

(51) Int. Cl.
*B41C 3/02* (2006.01)
*C25D 1/10* (2006.01)
*B29C 33/40* (2006.01)
*B29C 45/14* (2006.01)
*B29B 13/00* (2006.01)

(52) U.S. Cl. .................. 205/67; 205/70; 264/219; 264/221; 264/259; 264/271.1; 264/299; 264/313; 264/317; 264/318; 264/328.1

(58) Field of Classification Search ............... 205/118, 205/135, 170, 181, 182, 220, 221, 223, 67, 205/70; 264/219, 221, 259, 271.1, 299, 313, 264/317, 318, 328.1

See application file for complete search history.

(56) References Cited

U.S. PATENT DOCUMENTS

| | | | |
|---|---|---|---|
| 5,190,637 A | * | 3/1993 | Guckel ................. 205/118 |
| 5,234,571 A | * | 8/1993 | Noeker ................. 205/70 |
| 6,027,630 A | * | 2/2000 | Cohen ................. 205/135 |
| 6,422,528 B1 | * | 7/2002 | Domeier et al. ........ 249/60 |
| 6,660,151 B1 | * | 12/2003 | Lessmollmann et al. .. 205/50 |
| 6,692,680 B2 | * | 2/2004 | Lee et al. .............. 264/485 |

OTHER PUBLICATIONS

Cohen et al., "EFAB: Rapid, low-cost desktop micromachining of high aspect ratio true 3-D MEMS," 12th IEEE International Conference on Microelectromechanical Systems, pp. 244-251 (Jan. 17-21, 1999).*

* cited by examiner

*Primary Examiner*—Edna Wong
(74) *Attorney, Agent, or Firm*—Dennis R. Smalley

(57) ABSTRACT

Molded structures, methods of and apparatus for producing the molded structures are provided. At least a portion of the surface features for the molds are formed from multilayer electrochemically fabricated structures (e.g. fabricated by the EFAB™ formation process), and typically contain features having resolutions within the 1 to 100 μm range. The layered structure is combined with other mold components, as necessary, and a molding material is injected into the mold and hardened. The layered structure is removed (e.g. by etching) along with any other mold components to yield the molded article. In some embodiments portions of the layered structure remain in the molded article and in other embodiments an additional molding material is added after a partial or complete removal of the layered structure.

1 Claim, 19 Drawing Sheets

METHODS OF AND APPARATUS FOR MOLDING STRUCTURES USING SACRIFICIAL METAL PATTERNS

RELATED APPLICATIONS

This application claims benefit of U.S. Provisional Patent Application No. 60/379,135, filed on May 7, 2002 which is hereby incorporated herein by reference as if set forth in full.

FIELD OF THE INVENTION

The present invention relates generally to the field of Electrochemical Fabrication and the associated formation of three-dimensional structures via a layer-by-layer build up of deposited materials. More particularly it relates to the use of electrochemically fabricated structures as sacrificial molding patterns.

BACKGROUND

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen® Corporation) of Burbank, Calif. under the name EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. of Burbank, Calif. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

1. A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.
2. A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.
3. A. Cohen, "3-D Micromachining by Electrochemical Fabrication", Micromachine Devices, March 1999.
4. G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.
5. F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.
6. A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.
7. F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.
8. A. Cohen, "Electrochemical Fabrication (EFAB™)", Chapter 19 of The MEMS Handbook, edited by Mohamed Gad-El-Hak, CRC Press, 2002.
9. "Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.
2. Then, blanket depositing at least one additional material by electrodeposition so that the additional deposit covers both the regions that were previously selectively deposited onto, and the regions of the substrate that did not receive any previously applied selective depositions.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6 separated from mask 8. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1F. FIG. 1D shows an anode 12' separated from a mask 8' that comprises a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A to 3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

The '630 patent also explains that one microfabrication process, known as LIGA generates 2.5-D extruded shapes by molding materials around metal molds which were formed by the metals being electrodeposited within openings in thick synchrotron-processed photoresists.

Furthermore, the '630 patent indicates that its electroplating processes can also be used to manufacture tooling for molding (e.g., injection molding, metal injection molding, reaction injection molding, thermoforming, blow molding, and die casting). Mold inserts can be manufactured by orienting mold inserts so that the ejection axis of the part is parallel to the stacking axis of the layers and the parting surface of the part to be molded is the last layer deposited.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal Layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

From the above description, it is clear that electrochemical fabrication techniques can be used to make complex structures and particularly complex microstructures from many layers of deposited material. It is also clear that electrochemically fabricated structures can be used as tooling for molds that are used to generate multiple copies of objects. However these molds cannot be readily used to automatically produce structures with complex internal geometries and in particular one-piece structures.

A need remains in the field for extending the range of capabilities and in particular for expanding the range of materials and processes available for forming desired structures and devices of arbitrary geometric configuration and particularly for devices with complex internal configurations.

SUMMARY OF THE INVENTION

It is an object of some embodiments of some aspects of the invention to supplement electrochemical fabrication techniques to expand the capabilities of electrochemical fabrication processes to meet the structural and functional requirements for varying applications and thus to expand the potential applications available to the technology.

It is an object of some embodiments of some aspects of the invention to provide an enhanced molding technique that expands the availability of microstructure materials.

It is an object of some embodiments of some aspects of the present invention to provide an enhanced molding technique that expands the range of structures that can be molded using electrochemically produced structures.

Other objects and advantages of various embodiments will be apparent to those of skill in the art upon review of the teachings herein. The various aspects of the invention, set forth explicitly herein or otherwise ascertained from the teachings herein, may address any one of the above objects alone or in combination, or alternatively may not address any of the objects set forth above but instead address some other object ascertained from the teachings herein. It is not intended that all of these objects be addressed by any single aspect of the invention even though that may be the case with regard to some aspects.

A first aspect of the invention provides a method of forming a three-dimensional structure from a molding material, including: (A) providing a mold having a mold structure that includes a sacrificial material, the sacrificial material having a surface that defines a desired molding pattern; (B) placing flowable molding material against the desired molding surface and allowing or causing the molding material to solidify to pattern at least a portion of the three-dimensional structure; (C) separating the patterned three-dimensional structure from the mold, wherein the separating is accomplished, at least in part, by destroying the desired molding pattern defined by the surface without significantly damaging the molding material such that an image of the molding pattern remains on a surface of the patterned three-dimensional structure, wherein the desired molding pattern is formed by a process including: electrochemically depositing multiple layers, each including at least one deposition material deposited adjacent to and adhered to a previously deposited layer including at least one deposition material.

A second aspect of the invention provides a method of forming a three-dimensional structure from a molding material, including: (A) providing a mold having a mold structure that includes a sacrificial material, the sacrificial material having a surface that defines a desired molding pattern; (B) placing flowable molding material against the desired molding surface and allowing or causing the molding material to solidify to pattern at least a portion of the three-dimensional structure; (C) separating the patterned three-dimensional structure from the mold, wherein the separating is accomplished, at least in part, by destroying the desired molding pattern defined by the surface without significantly damaging the molding material such that an image of the molding pattern remains on a surface of the patterned three-dimensional structure, wherein the desired molding pattern includes a structure that was, at least in part, formed from a plurality of adhered layers wherein at least portions of some layers were formed via an electrodeposition operation of a conductive material.

A third aspect of the invention provides a method of forming an integral three-dimensional structure from a molding material, including: (A) providing a mold having a mold structure that includes a sacrificial material, the sacrificial material defining at least in part a desired molding pattern; (B) filling the mold with flowable molding material and allowing or causing the molding material to solidified to pattern the three-dimensional structure, (C) separating the patterned three-dimensional structure from the mold, wherein the separating is accomplished, at least in part, by destroying the molding pattern without significantly damaging the molding material and removing any residual sacrificial material from the patterned three-dimensional structure such that an image of the molding pattern remains on a surface of the patterned three-dimensional structure, wherein the desired molding pattern is formed, at least in part, by an electrochemical fabrication process including: forming a plurality of layers such that each successive layer is formed adjacent to and adhered to a previously deposited layer, wherein said forming includes a plurality of the selective depositing operations which include (a) locating a mask on or in proximity to a plating surface a portion of which is to receive a deposition; (b) in presence of a plating solution, conducting an electric current through the at least one opening in the mask between an anode and the plating surface, wherein the anode includes a selected deposition material, and wherein the plating surface functions as a cathode, such that the selected deposition material is deposited onto the plating surface to form at least a portion of a layer; and (c) separating the mask from the plating surface.

Further aspects of the invention will be understood by those of skill in the art upon reviewing the teachings herein. Other aspects of the invention may involve apparatus that can be used in implementing one or more of the above method aspects of the invention. These other aspects of the invention may provide various combinations of the aspects presented above, and/or additions of various features of one or more embodiments to the aspects presented above as well as provide other configurations, structures, functional relationships, and processes that have not been specifically set forth above.

BRIEF DESCRIPTION OF THE DRAWINGS

FIG. 13A depicts a driving mechanism for the valve structure depicted in FIG. 12C while

DETAILED DESCRIPTION OF EMBODIMENTS OF THE INVENTION

FIGS. 1A-1G, 2A-2F, and 3A-3C illustrate various features of one form of electrochemical fabrication that are known. Other electrochemical fabrication techniques are set forth in the '630 patent referenced above, in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

Figure 1A:
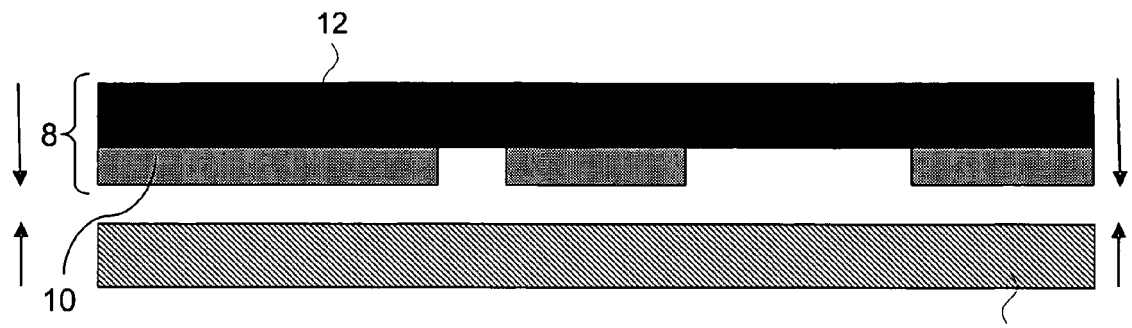
FIGS. 1A-1C schematically depict side views of various stages of a CC mask plating process, while FIGS. 1D-1G schematically depict a side views of various stages of a CC mask plating process using a different type of CC mask.
Figure 1B:
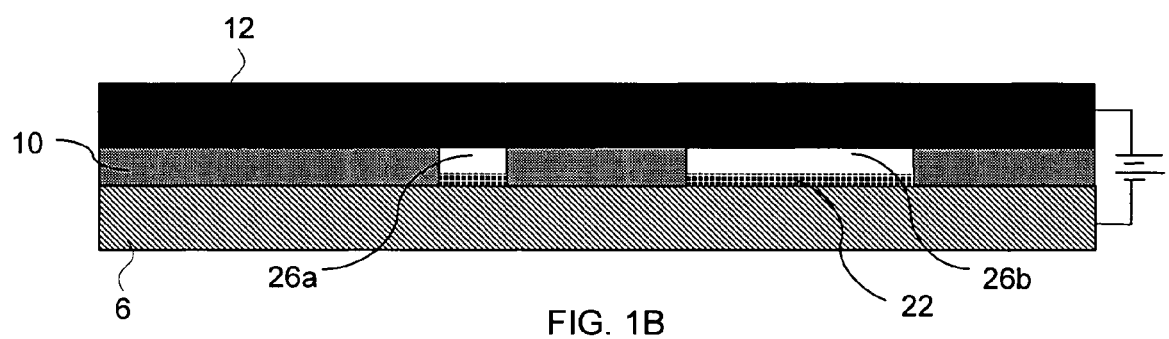
Figure 1C:
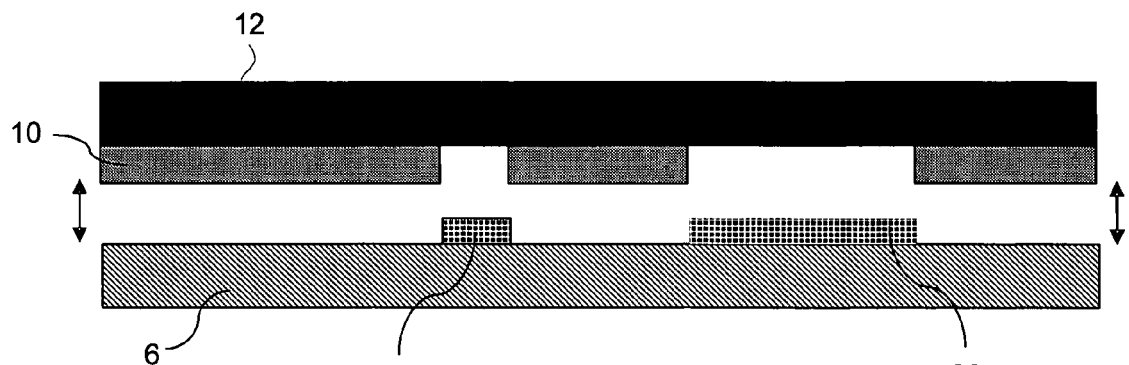
Figure 1D:
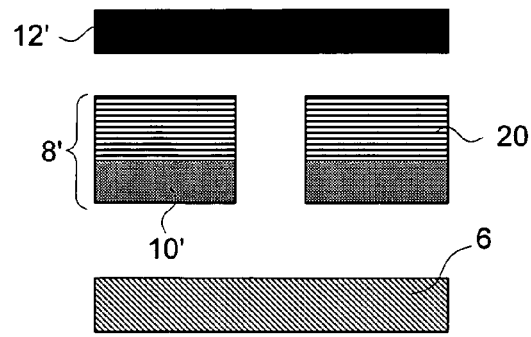
Figure 1E:
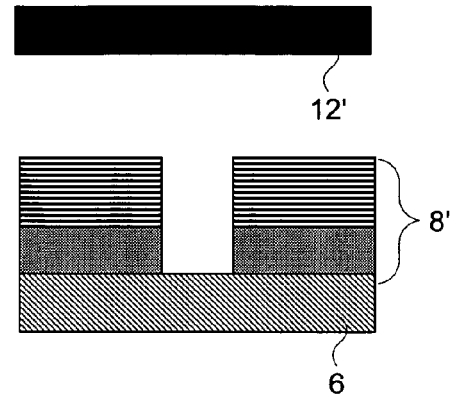
Figure 1F:
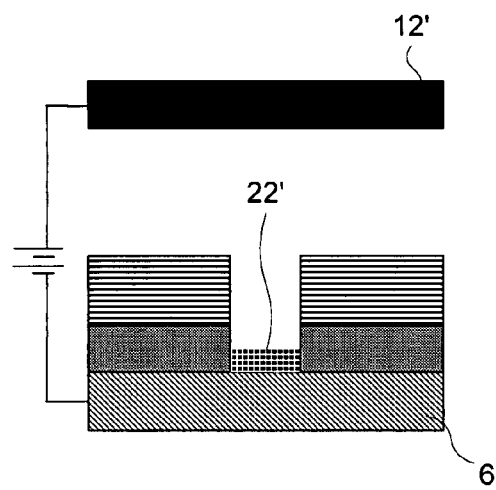
Figure 1G:
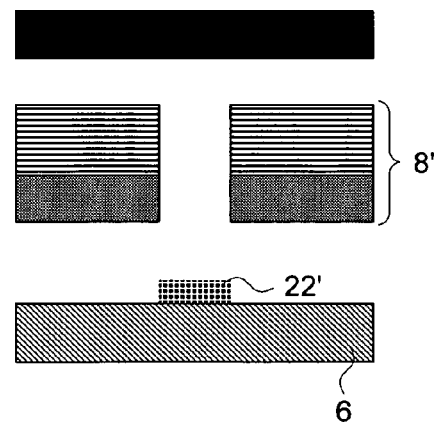
Figure 2A:
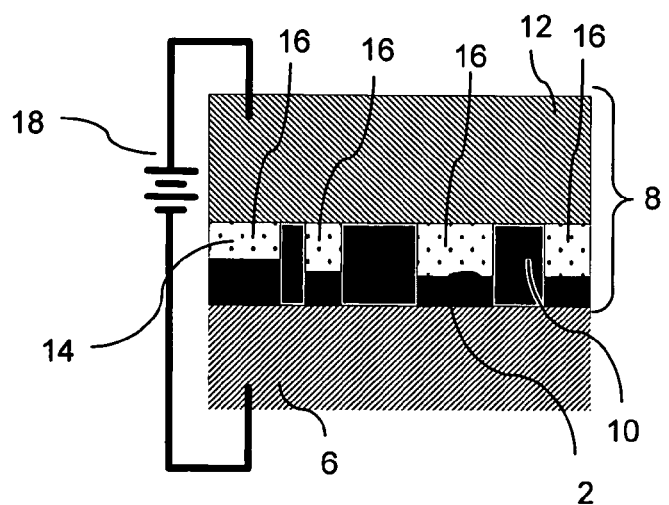
FIGS. 2A-2F schematically depict side views of various stages of an electrochemical fabrication process as applied to the formation of a particular structure where a sacrificial material is selectively deposited while a structural material is blanket deposited.
Figure 2B:
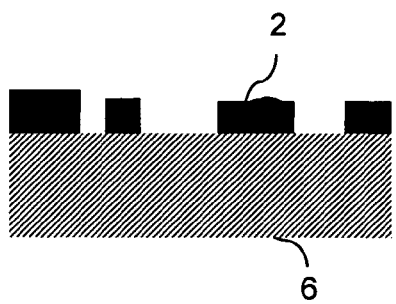
Figure 2C:
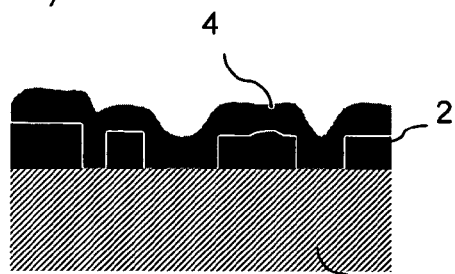
Figure 2D:
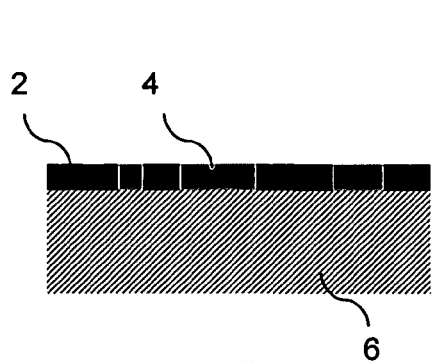
Figure 2E:
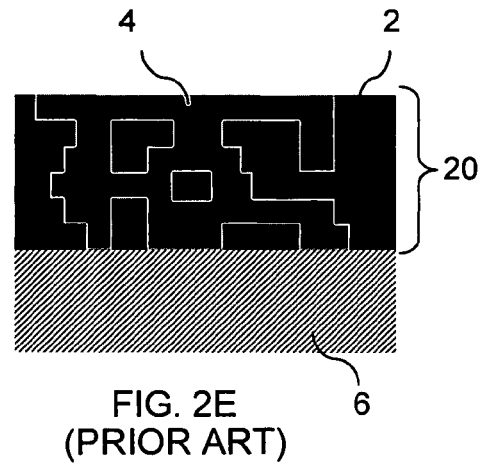
Figure 2F:
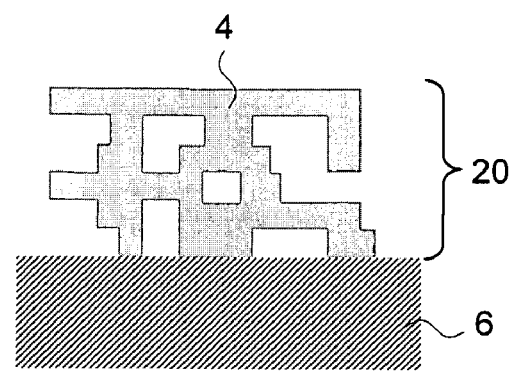
Figure 3A:
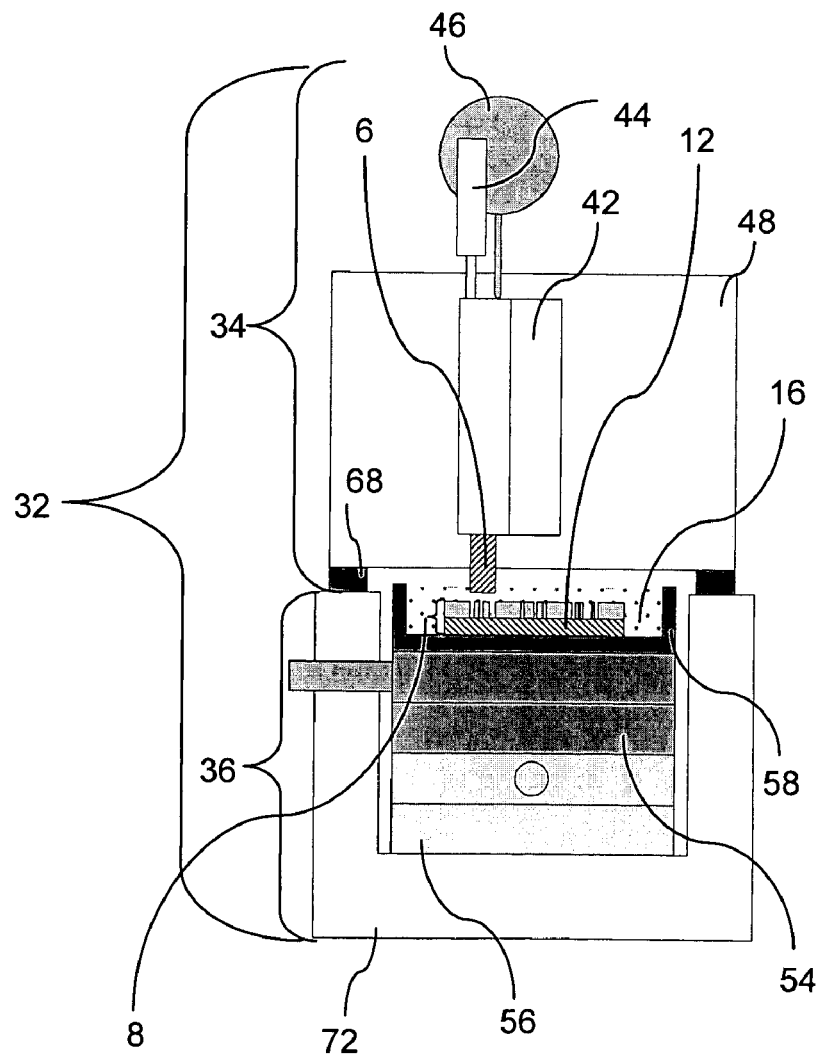
FIGS. 3A-3C schematically depict side views of various example subassemblies that may be used in manually implementing the electrochemical fabrication method depicted in FIGS. 2A-2F.
Figure 3B:
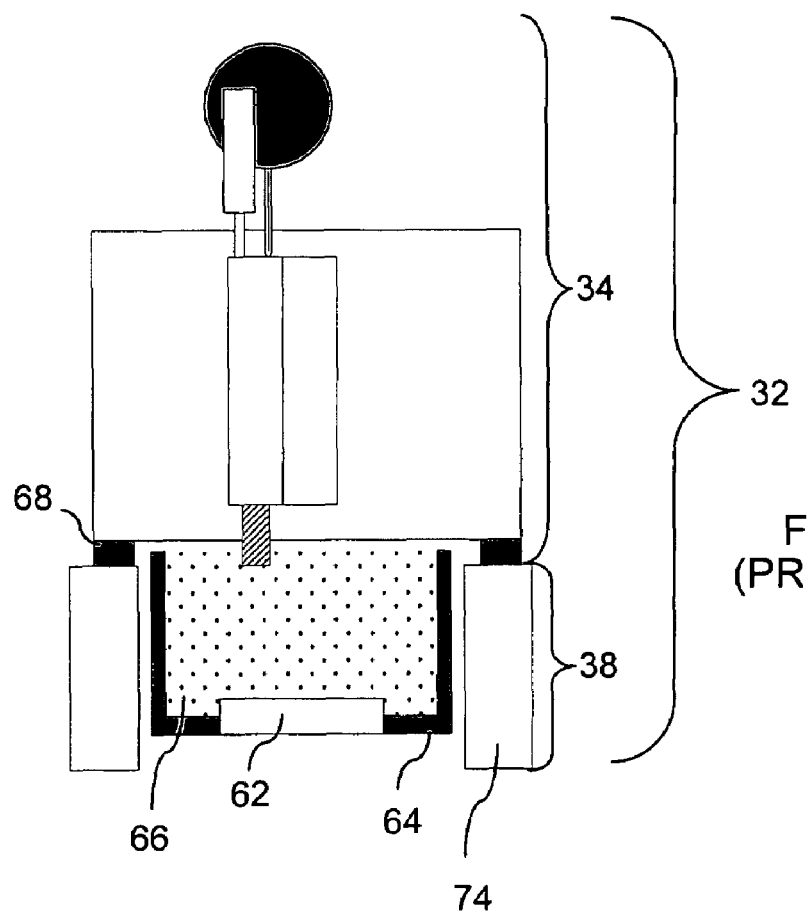
Figure 3C:
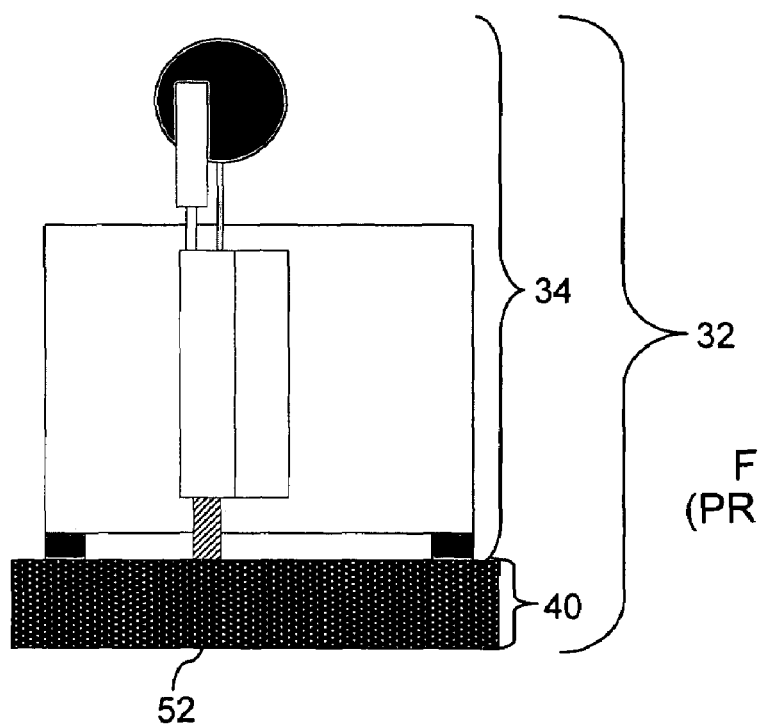
Figure 4A:
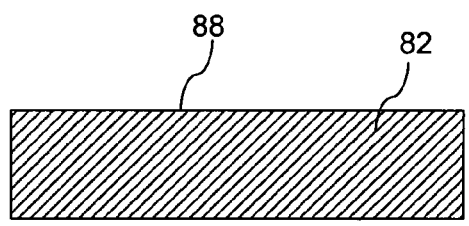
FIGS. 4A-4F schematically depict the formation of a first layer of a structure using adhered mask plating where the blanket deposition of a second material overlays both the openings between deposition locations of a first material and the first material itself.
Figure 4B:
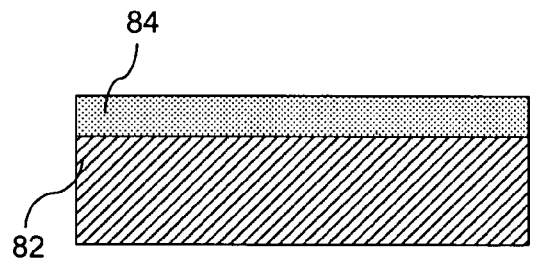
Figure 4C:
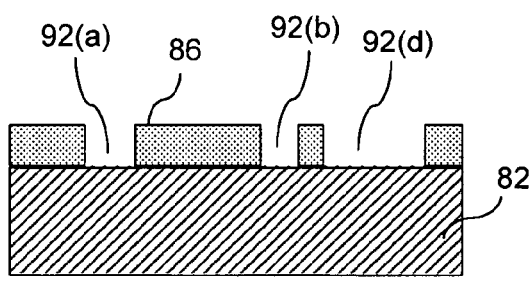
Figure 4D:
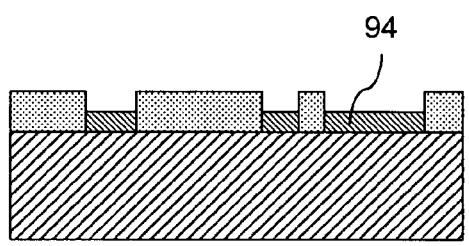
Figure 4E:
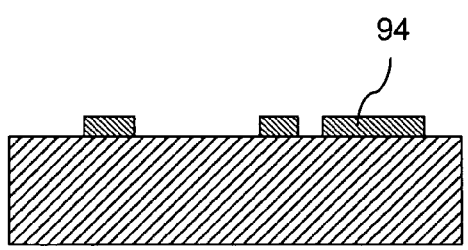
Figure 4F:
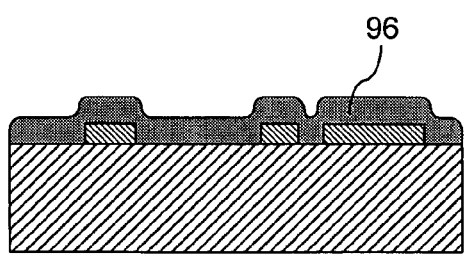
Figure 4G:
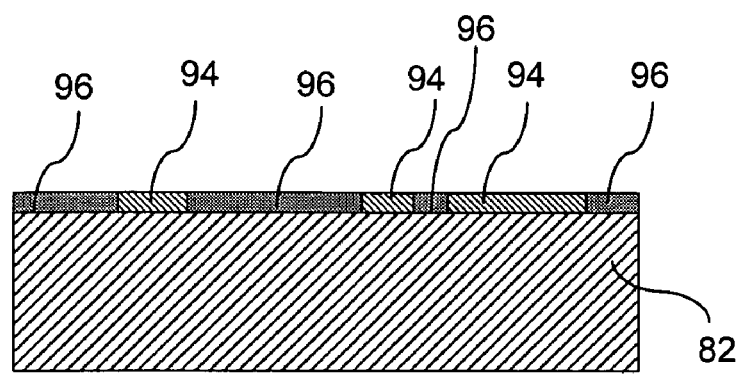
FIG. 4G depicts the completion of formation of the first layer resulting from planarizing the deposited materials to a desired level.
Figure 4H:
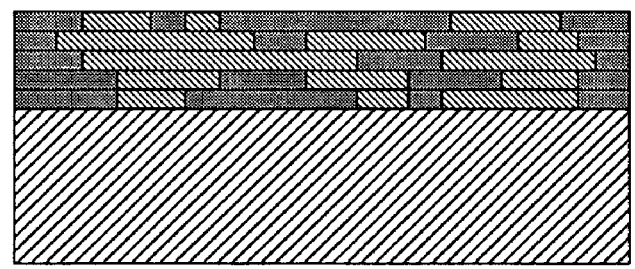
FIGS. 4H and 4I respectively depict the state of the process after formation of the multiple layers of the structure and after release of the structure from the sacrificial material.
Figure 4I:
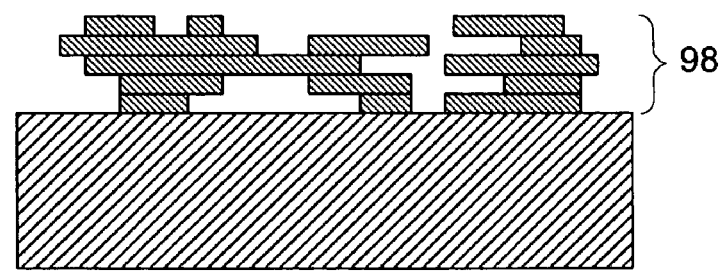

FIGS. 4A-4F illustrate various stages in the formation of a single layer of a multi-layer fabrication process where a second metal is deposited on a first metal as well as in openings in the first metal so that the first and second metal form part of the layer. In FIG. 4A a side view of a substrate 82 is shown onto which patternable photoresist 84 is cast as shown in FIG. 4B. In FIG. 4C a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D a metal 94 (e.g. nickel) is shown as having been electroplated into the openings 92(a)-92(c). In FIG. 4E the photoresist has been removed (i.e. chemically stripped) from the substrate to expose regions of the substrate 82 which are not covered with the first metal 94. In FIG. 4F a second metal 96 (e.g. silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure is shown where each layer consists of two materials. For most applications, one of these materials is removed as shown in FIG. 4I to yield a desired 3-D structure 98 (e.g. component or device).

Figure 5:
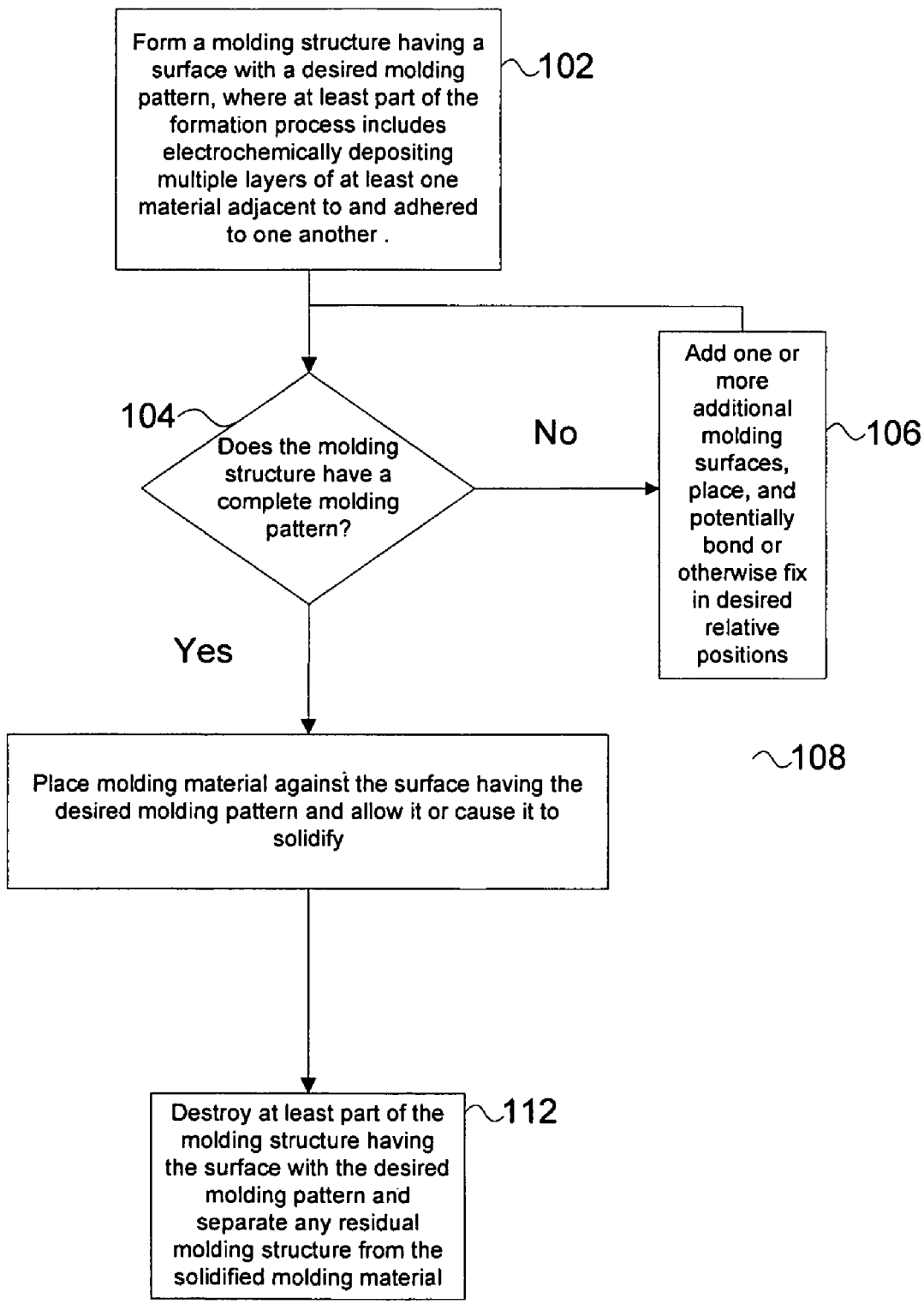
FIG. 5 depicts a flowchart of the basic steps in a preferred embodiment of the invention.

FIG. 5 presents the basic steps of a preferred embodiment of the invention in the form of a flowchart. The process starts with operation 102 which calls for formation of a molding structure having a surface with a desired molding pattern. The molding structure is formed, at least in part, by an electrochemical fabrication process which includes electrochemically depositing multiple layers of at least one material adjacent to and adhered to one another. The electrochemical fabrication process used may be similar to the one illustrated in FIGS. 1A-1C and 2A-2F or to the one illustrated in FIGS. 4A-4I or it may be another process set-forth in the '630 patent, a process set forth in one of the other previously incorporated publications, a process described in one of the patents or applications that is included in the listing of incorporated patents and applications set forth hereafter, or the process may be a combination of various approaches described in these publications, patents, and applications, or otherwise known or ascertainable by those of skill in the art.

In some electrochemical fabrications processes, masks of various types may be used in patterning layers of material. These masks may be used in selective etching operations or in selective deposition operations. These masks and masking operations may take on various forms, for example: (1) conformable contact masks and masking operations, (2) proximity masks and masking operations (i.e. operations that use masks that at least partially selectively shield a substrate by their proximity to the substrate even if contact is not made between the mask and the substrate), (3) non-conformable masks and masking operations (i.e. masks and operations based on masks whose contact surfaces are not significantly conformable), and/or (4) adhered masks and masking operations (masks and operations that use masks that are adhered to a substrate onto which selective deposition or etching is to occur as opposed to only being contacted to it). Adhered masks may be formed from patterned photoresists, selectively deposited materials, e.g. via ink jet or extrusion, selectively ablated materials, transfer plated materials, and the like.

Portions of the molding structures may also be formed by any other appropriate three-dimensional modeling process that yields structures that can be separated from a molding material after the molding material has been solidified.

The process moves forward to inquiry 104 where the question is posed as to whether the molding structure obtained is the complete molding pattern? If the answer is "no", the process proceeds to operation 106, and if the answer is "yes" the process proceeds to operation 108. At operation 106 one or more additional molding surfaces are placed and potentially bonded to or otherwise fixed in position relative to the molding structure obtained in operation 102. The process then loops back to inquiry 104 and again poses the question as to whether the formation of the mold structure is completed. The process continues to loop through operations 104 and 106 until, a "yes" response is obtained from operation 104.

Operation 108 takes the completed mold and places a desired molding material against the surface so as to transfer the shape of the molding surface to the molding material. The molding material is then allowed to or is made to solidify. Prior to placing the molding material and the molding surface in contact with each other, various treatments may be performed to aid in the eventual release that will occur or treatments may be used to texture the molding surface in a desired manner. Of course, in alternative embodiments, individual molding surfaces can additionally or alternatively be treated prior to their combination to produce the entire mold).

After solidification of the molding material, at least part of the molding structure (e.g. the part having the surface with the desired molding pattern) is destroyed as indicated in operation 112. Operation 112 serves to release the molded structure form the mold or molding pattern. The destruction of the molding structure may occur in various ways. The destruction operation may occur in a single step or it may be achieved in a multistep process. The destruction may include a chemical etching step or an electrochemical etching step. If the destruction process doesn't complete the separation of the molding structure from the molded material, additional operations may be performed to complete the separation (e.g. one or more rinses, use of one or more etching operations with different etchants, use of vacuum, use of gas pressure, and the like). After separation, the molded structure, device, or component may be further processed (e.g. attachment of additional components, application of surface treatments, and the like) or it may be put to its desired use.

Though not shown in FIG. 5 some embodiments may not end the molding process at operation 112 but instead may cycle back to operation 108 to add a further molding material which may be different from or the same as the molding material used originally in operation 108. After such additional molding operations, the process may end or one or more additional separation operations (e.g. operations like 112), and/or additional molding operations may be performed until the final molded structure is obtained.

Figure 6A:
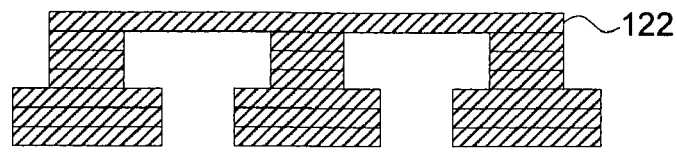
FIGS. 6A-6E depict side views of various stages in the production of a molded article from an open mold whose surface configuration is in part defined by a sacrificial electrochemically produced molding structure.
Figure 6B:
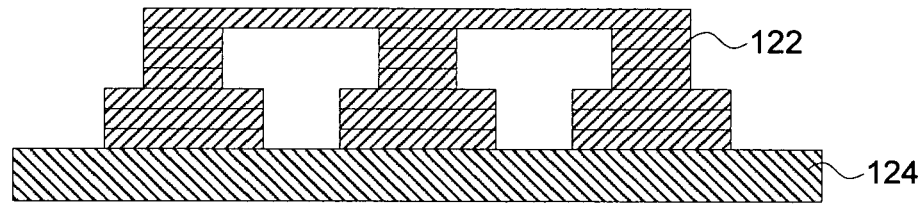
Figure 6C:
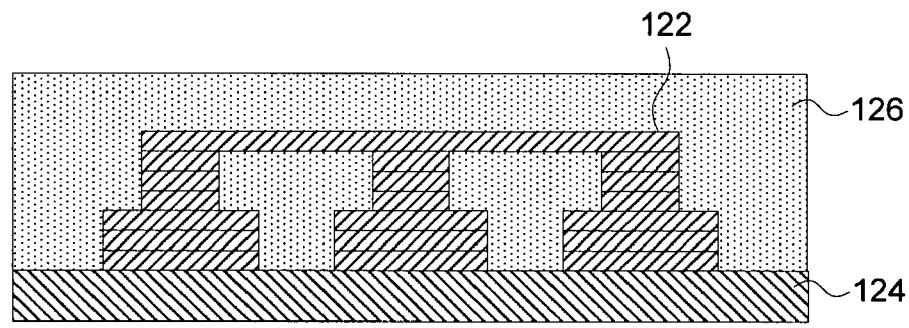
Figure 6D:
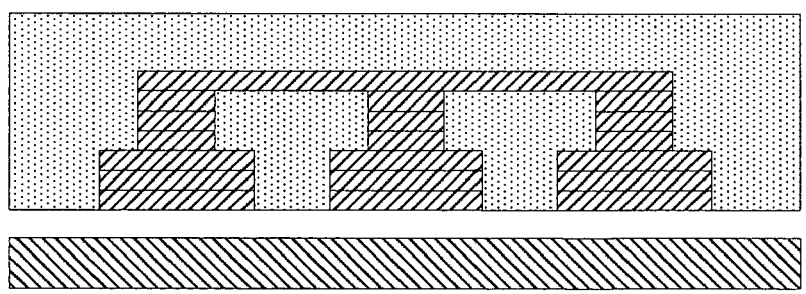
Figure 6E:
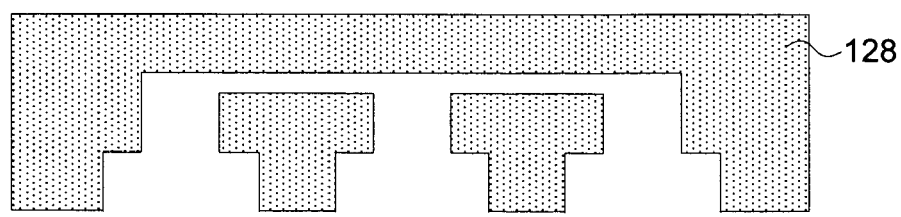

The basic process of FIG. 5 is illustrated by the molding operations exemplified in FIGS. 6A-6E. FIG. 6A shows a side view of a multi-layer structure 122 produced by electrochemical fabrication. FIG. 6B shows the structure 122 adhered to or at least placed against a molding base 124. As the sides and top of the molding structure are not considered to be of particular importance in the present example, the mold is not shown as having such surfaces. The adding of the molding base 124 to structure 122 to complete the mold causes the process flow to proceed from operation 104 to operation 106 and then back to operation 104. FIG. 6C shows the placement of a molding material 126 against and around the molding surface formed by structure 122 and molding base 124. The material is solidified. FIG. 6D shows the separation of the molding base 124 from both the molding structure 122 and the solidified molding material 126. The separation of the molding base may occur with the aid of a release agent (e.g. a thin wax-like coating over the base that allowed nominal adhesion between the structure 122 and the base but still allowed eventual separation) or by the dissolution of the molding base material. FIG. 6E depicts the molded structure 128 formed from solidified molding material 126 after separation of the molding structure 122 therefrom. In the present example, destruction of the molding structure 122 was required as the molding structure was mechanically locked into the solidified mold material due to the geometric configurations of each.

Figure 7A:
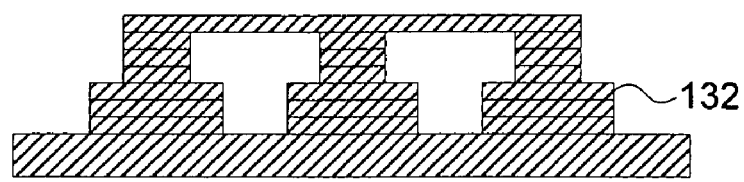
FIGS. 7A-7C depict side views of various stages in the production of a molded article from an open mold whose surface configuration is entirely formed by a sacrificial electrochemically produced molding structure.
Figure 7B:
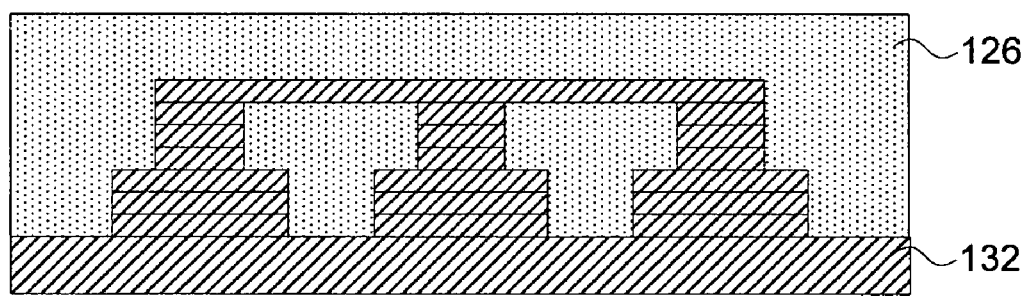
Figure 7C:
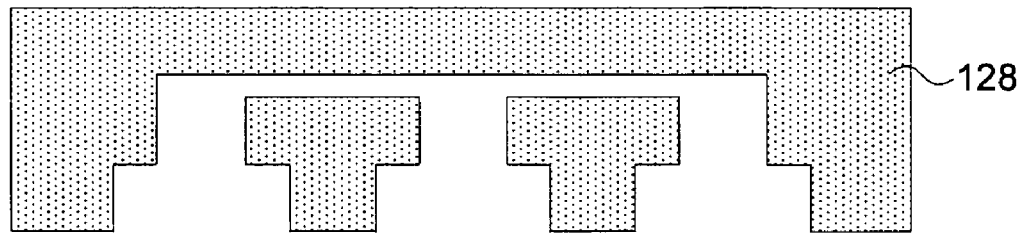

FIGS. 7A-7C provide another example of a molding operation that follows the flow of FIG. 5. In this example, however, the process doesn't proceed through operation 106 since the entire molding structure is complete as it is received from operation 102. FIG. 7A depicts the molding structure 132 as received from operation 102. FIG. 7B depicts the molding structure in contact with the molding material 126. FIG. 7C depicts the molded structure 128 after separation form the molding structure 132.

Figure 8A:
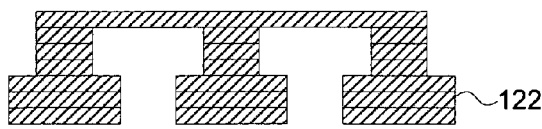
FIGS. 8A-8E depict side views of various stages in the production of a molded article from a closed mold whose surface configuration is partially formed by a sacrificial electrochemically produced molding structure

FIGS. 8A-8E depict another example of a molding operation but this time using a closed mold whose surface configuration is partially formed by a sacrificial electrochemically produced molding structure 122. FIG. 8A shows a side view of a multi-layer structure 122 produced by electrochemical fabrication.

Figure 8B:
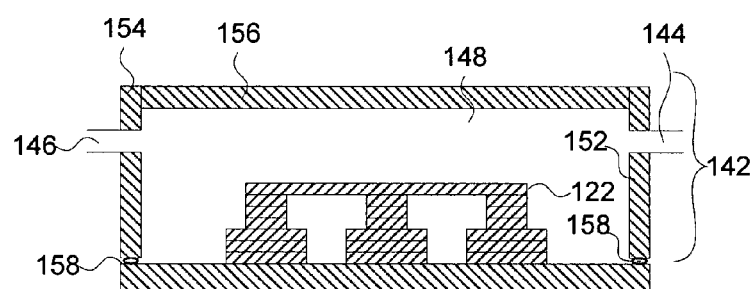

FIG. 8B shows the structure 122 adhered to or at least placed against a molding base 124. Remaining mold surfaces are provided in the form of a lid-like structure 142 with side walls 152 and 154, top portion 156, and a molding material inlet line 144 and outlet line 146. As the inlet and outlet openings are on the side walls of the lid-like structure 142, unless it is acceptable to have the lid destroyed after a single molding operation (i.e. for it to be sacrificial) or it is acceptable to go through other post molding operations to remove any binding or locking between the molded material (i.e. solidified molding material) and the lid and especially the inlet and outlet lines 144 and 146, it may be desirable to have the walls 152 and 154 separable from the top portion 156. After molding, air pressure applied to the inlet and outlet lines may be used to help separate the walls and/or top from the solidified molding material. Prior to injecting molding material into the mold, the outlet may be used to draw a vacuum on the interior portion of the mold (i.e. mold cavity 148). Alternatively, outlet 148 may act as a gas outlet during the course of injecting or filling the mold cavity 148 with molding material 126. The need for the addition of the molding base 124, sides 152 and 154 and top 156 cause the process flow to progress from operation 104 to operation 106 and then back to operation 104. The junction between the plating base 124 and the walls 152 and 154 are shown as being sealed with an o-ring 158. Such seals may also exist between any other mold surfaces that are to be joined, such as, for example, between wall 152 and top 156 and wall 154 and top 156.

Figure 8C:
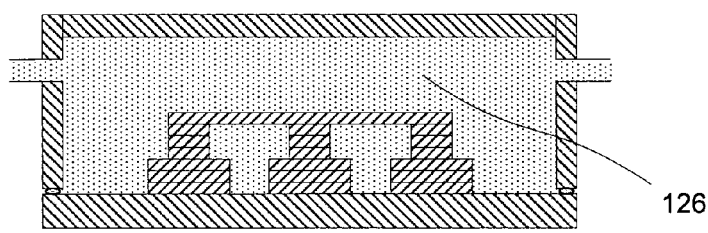

FIG. 8C shows the molding material 126 filling the mold cavity 148 and surrounding structure 122. The material 126 is solidified while located in mold cavity 148 to become molded material 128 (as shown in FIGS. 8D and 8E).

Figure 8D:
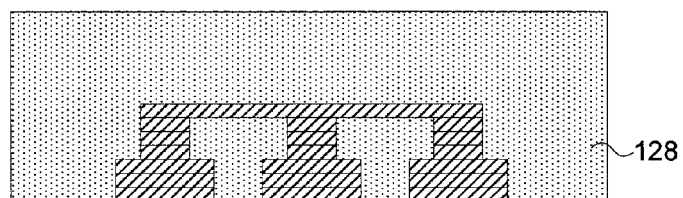

FIG. 8D shows the molded material 128 separated from molding base 124, sides 152 and 154, and top 156. The molding structure 122, however, remains locked in the molded material 128. The separation of the various elements of the mold from the molded material may occur with the aid of a release agent or by dissolution of all or a portion of the components. Any artifact remaining from the molded material remaining in the fill or outlet tubes may be removed. Ease of removal of such material may be enhanced by providing a narrowing of the inlet and outlet channels at the interface with the molding cavity such that when pulling the sidewalls away the material tends to fracture and separates at this weak point.

Figure 8E:
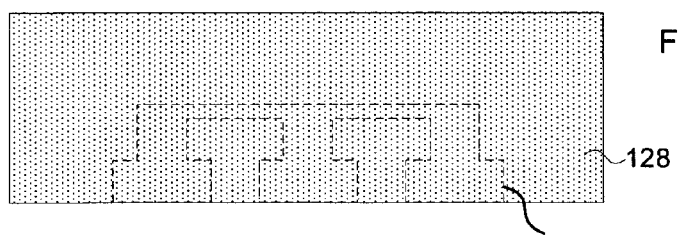

FIG. 8E depicts the molded structure 128 formed from solidified molding material 126 after separation of the molding structure 122 therefrom. In the present example, destruction of the molding structure 122 is required since the molding structure 122 is mechanically locked into the solidified mold material 126 due to the geometric configurations of each. Though the structures shown in FIGS. 6E and 8E are similar, the depiction of the surfaces molded by structure 122, are shown differently. In FIG. 8E the surfaces are shown by dashed lines 150 within a surrounding material so as to give emphasis to the fact that these surfaces, with the exception of the lower surface (i.e. the surface that was against the base 124), are completely encapsulated by molding material.

Figure 10A:
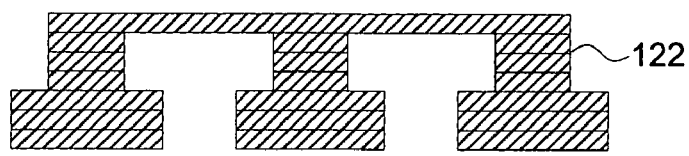
FIGS. 10A-10E depict side views of various stages in the production of a molded article from a closed multi-part mold where part of the configuration and surface detail of the molded article is provided by surface patterning on at least one of the surfaces of the multi-part mold and part of the configuration of the molded article is formed by a sacrificial electrochemically produced molding structure.
Figure 10B:
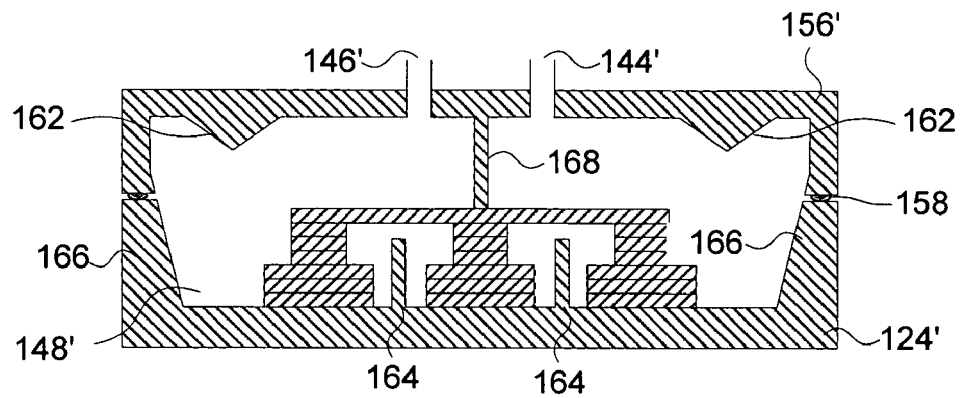
Figure 10C:
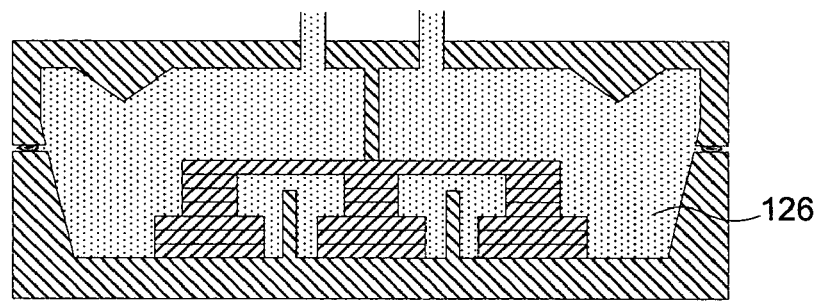
Figure 10D:
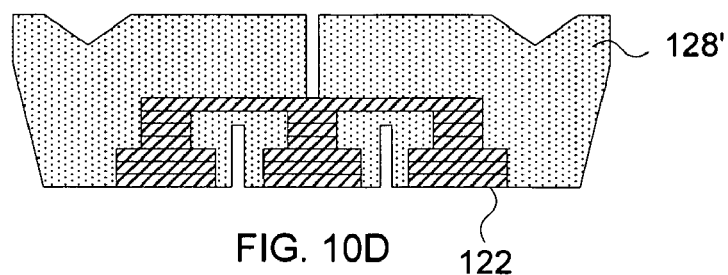

In an alternative embodiment, for example as shown in FIGS. 10B and 10C, the fill and outlet openings may be formed in top 156', which allows separation of the lid-like structure from the solidified molding material in a simple manner without needing to use a separable multi-part lid structure, needing to destroy the lid, or needing to go through other post molding operations. In another alternative, a single combined inlet/outlet may be used in the case of evacuating the cavity prior to filling it with mold material.

Figure 9A:
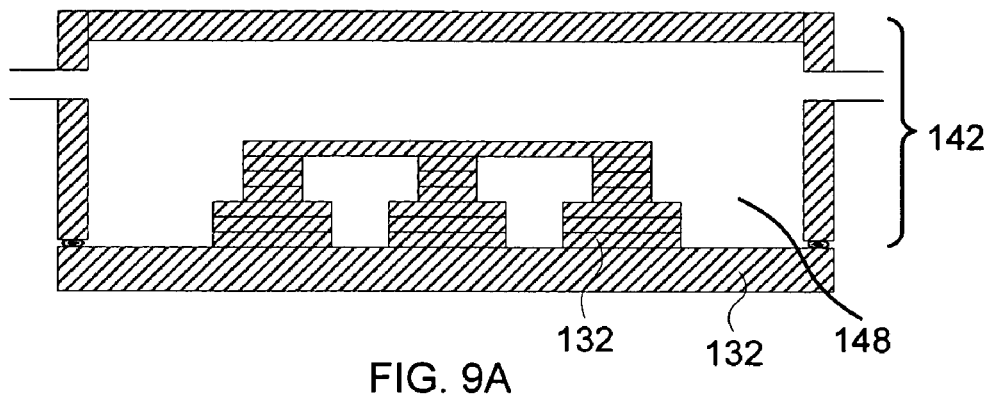
FIGS. 9A-9C depict side views of various stages in the production of a molded article from a closed mold whose surface configuration is entirely formed by a sacrificial electrochemically produced molding structure.
Figure 9B:
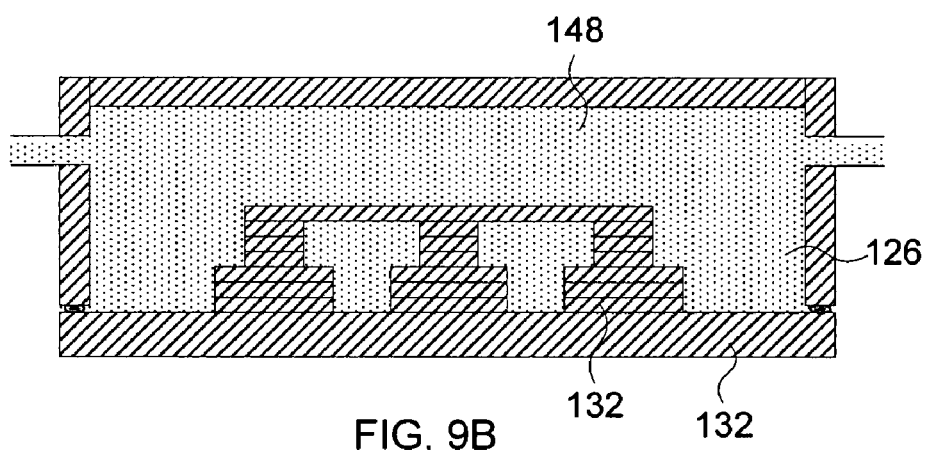
Figure 9C:
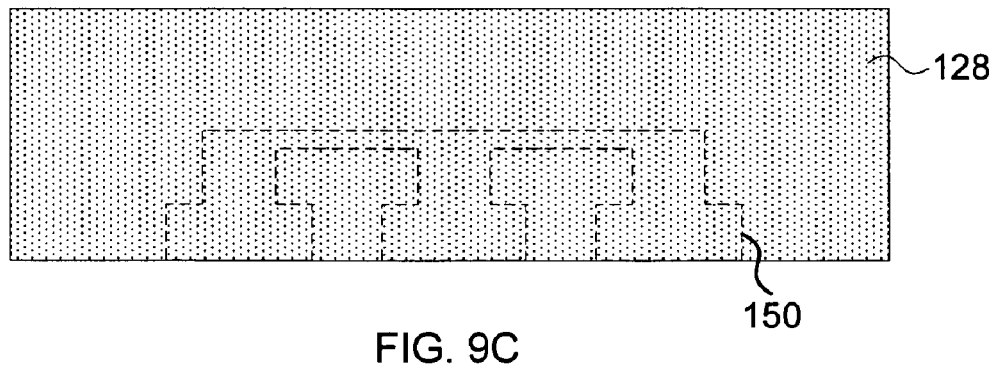

FIGS. 9A-9C provide an illustration of another example molding process that follows the flow of FIG. 5. FIG. 9A depicts the molding structure 132 as received from operation 102 in combination with the lid-like structure 142 where the molding structure 132 and lid-like structure 142 are shown as being formed from the same material. FIG. 9B depicts the mold cavity 148 filled with molding material 126, and FIG. 9C depicts the molded structure 128 after separation from the molding structure 132 and lid-like structure 142 which may be removed in a single operation.

Figure 10E:
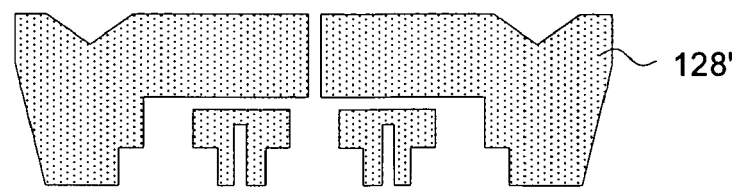

FIGS. 10A-10E are analogous to FIGS. 8A-8E with the exception that some specialized surface detail is provided to the molded structure 128' by the patterning of surfaces 162, 164, 166, and 168 of the multi-part mold. These patterned surfaces are separable from the molded material without destruction of the patterns. As with FIGS. 8A-8E, the other part of the surface configuration of the molded structure is formed by a sacrificial electrochemically produced molding structure 122. Like components and structures are designated with like reference numerals (i.e. 122, 126, and 158) and modified structures are indicated with primed reference numerals (e.g. 124', 144', 146', 148', and 156') compared to their counterparts in FIGS. 8A-8E. The final molded structure 128 is illustrated in FIG. 10E.

Figure 11A:
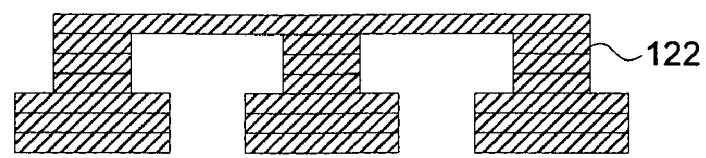
FIGS. 11A-11E depict-side views of various stages in the production of a molded article from a partially open mold whose surface configuration is formed in part by a sacrificial electrochemically produced molding structure, an attached molding structure, and the walls of a molding cavity.
Figure 11B:
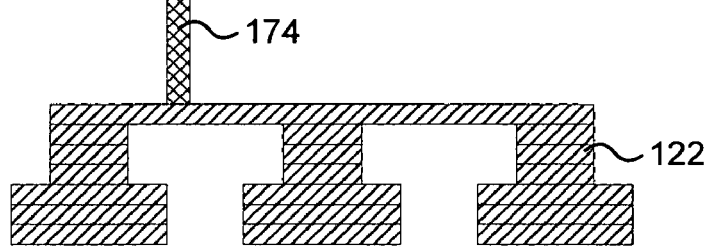
Figure 11C:
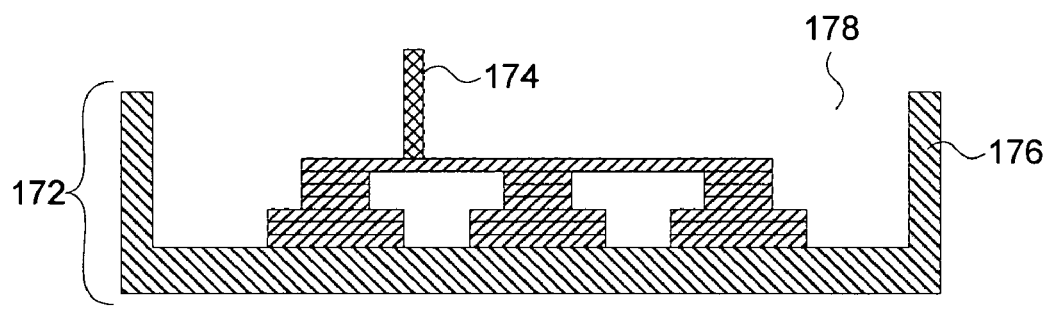
Figure 11D:
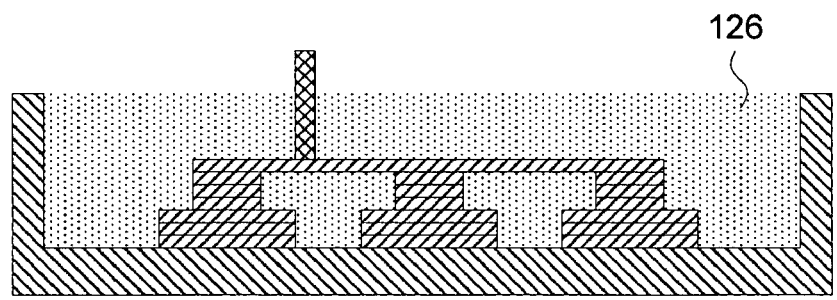
Figure 11E:
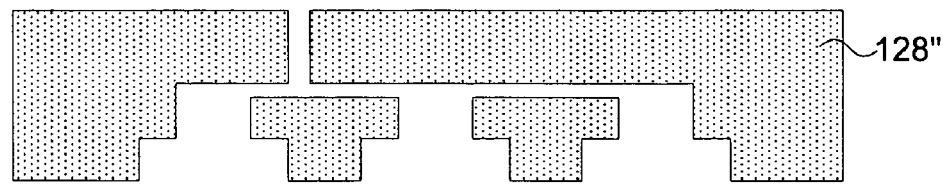

FIGS. 11A-11E depict another example of an alternative embodiment following the flow of FIG. 5, where a partially open mold 172 has a surface that results from a sacrificial electrochemically produced molding structure 122, a molding structure 174 that is independent of the base and walls 176 of the molding cavity 178 and that is positioned adjacent to and potentially attached to structure 122. FIG. 11A depicts the sacrificial molding structure 122 that is electrochemically fabricated. FIG. 11B depicts the molding structures 122 and 174 positioned relative to each other. FIG. 11D depicts the molding structures 122 and 174 positioned relative to base and walls 176 of the partially open mold 172. FIG. 11D depicts the molding cavity 178 filled with molding material 126. FIG. 11E depicts the molded structure 128" that results after removal of mold 172.

Figure 12A:
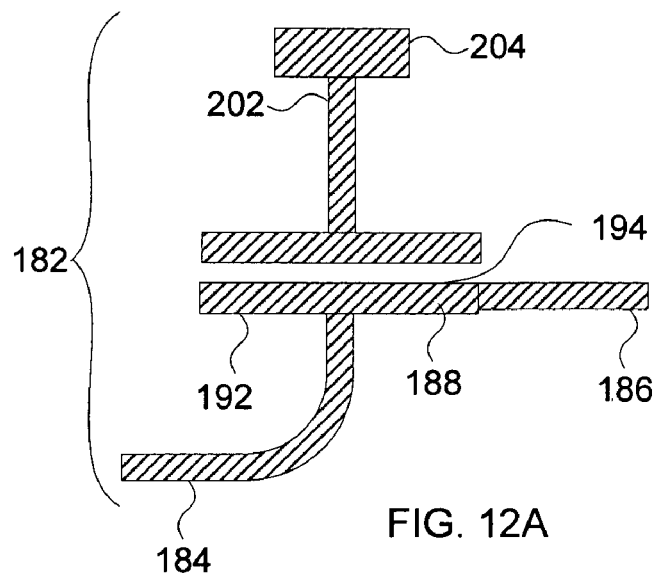
FIGS. 12A-12C depict views of various stages in production of a molded valve structure whose configuration is at least in part dictated by a sacrificial electrochemically produced molding structure.
Figure 12B:
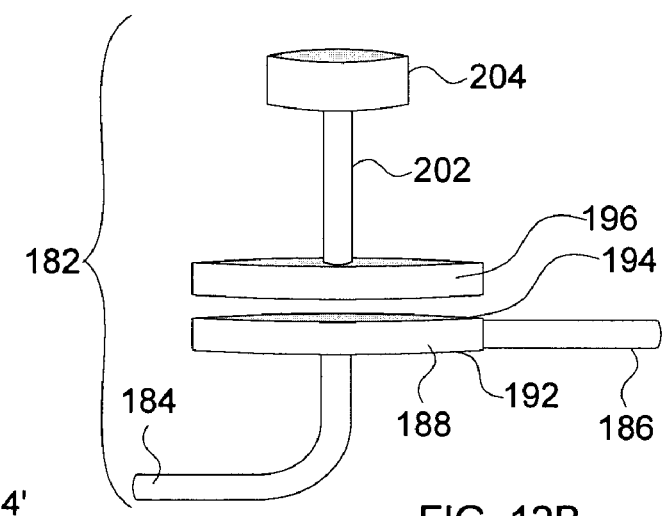
Figure 12C:
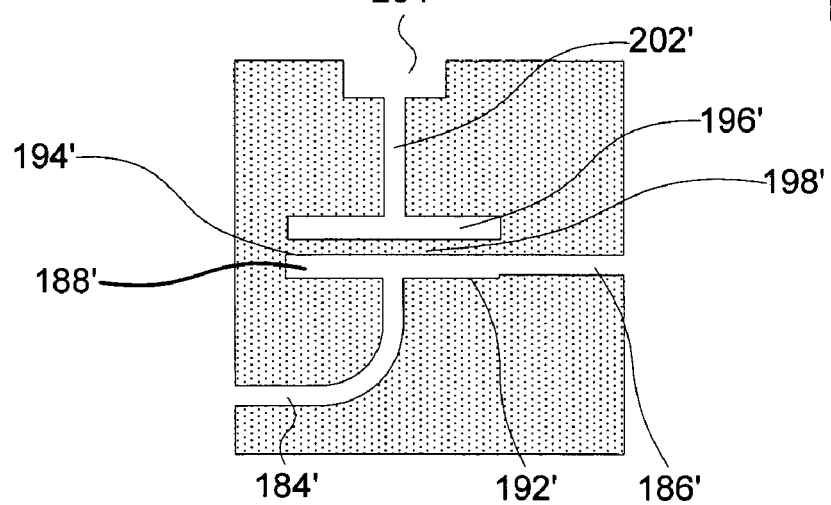

FIGS. 12A-12C depict an example of a sacrificial valve structure and corresponding molded valve structure. The configuration of the molded valve structure is dictated by a sacrificial electrochemically produced molding structure. FIG. 12A depicts a side view of the sacrificial electrochemically produced molding structure 182 whose design is the complement of the hollow regions within the valve structure to be formed. FIG. 12B depicts a perspective view of structure 182 while FIG. 12C depicts a side view of the valve structure molded from molding structure 182. Line element 184 after molding will become inlet or outlet tube 184'. Line element 186 after molding will become the other of the outlet or inlet tube 186'. The disc shaped element 188 will become a disc shaped cavity whose lower surface 192 becomes a valve seat 192' and whose distortable upper surface 194 becomes the valve seal 194'. Disc shaped element 196 becomes a cavity 196' that is separated from cavity 188' by thin flexible member 198' whose lower surface corresponds to the upper surface 194' of cavity 188'. The movement of thin member 198' is capable of causing sealing of the path between the inlet 184' or 186' and outlet 186' or 184'. The existence of disc shaped cavity 196' creates and allows thin member 198' to exist and be movable. Line element 202 becomes tube 202'. Cylindrical element 204 becomes cavity 204'. Cavity 204' and tube 202' allow the transfer of pressure (e.g. via a liquid or gas) or even movement of a rod-like element so as to cause the thin flexible member to be moved into and out of a sealing position.

Though the upper and lower structures shown in FIGS. 12A and 12B are shown as not connected, the structures may be placed separately in the mold and held in place using an appropriate fixture or adhesive. Alternatively, separate pieces may be connected together using a secondary material that is not removed when the sacrificial material is dissolved or otherwise removed.

Figure 13A:
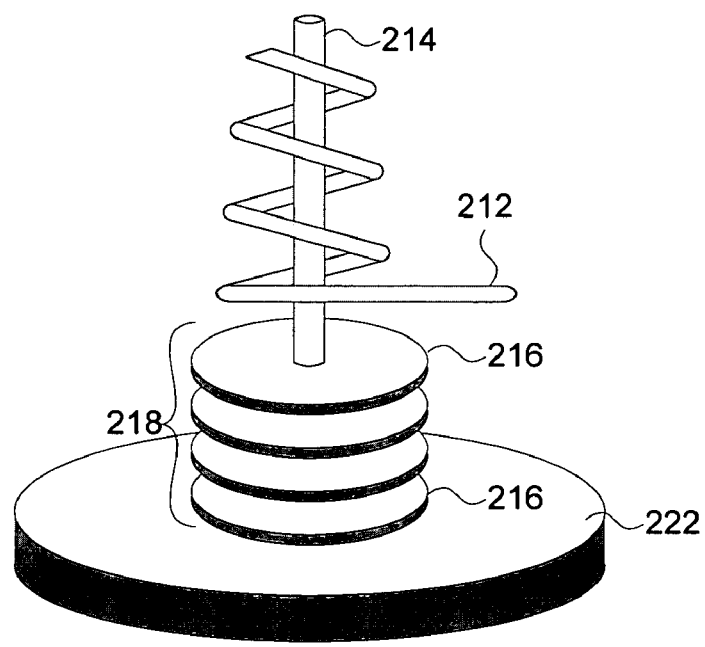
Figure 13B:
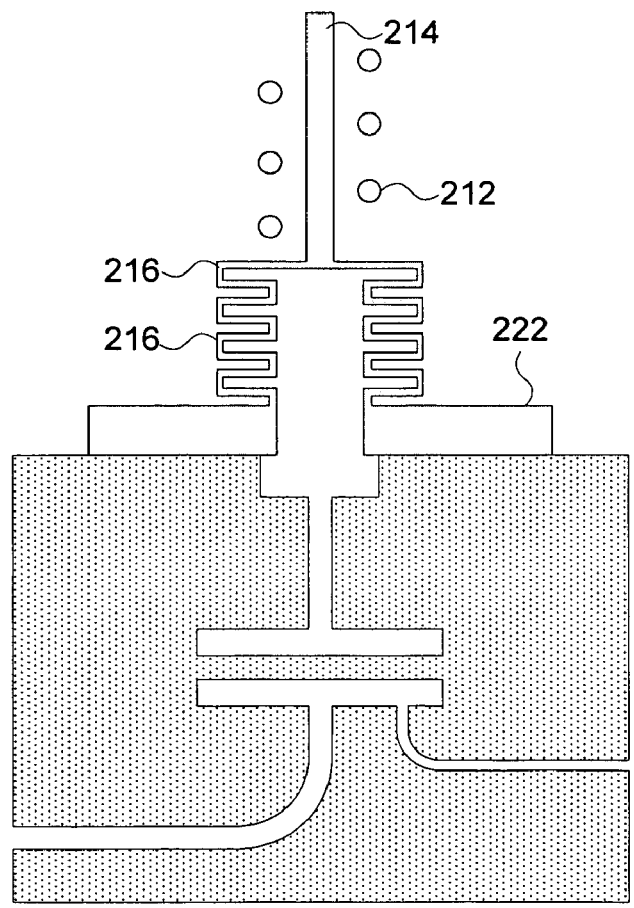
FIG. 13B depicts a side view of the combination of the driving mechanism and the valve structure.

FIG. 13A depicts a perspective view of a bellows system that can be used to drive the valve of FIG. 12C. FIG. 13B depicts a side view of the bellows system of FIG. 13A in combination with the valve element of FIG. 12C. A current can be made to flow through coil 212 so as to cause actuator rod 214 to move up or down (the rod may be biased in one position by a spring or the like, of just by pressure within the bellows. Actuator rod 214 is connected to a bellows 218. Elements 216 represent ribs of the bellows 218. Disc shaped element 222 provides a mounting base. The bellows system of FIGS. 13A and 13B may be formed independently of the valve of FIGS. 12C and 13B and then bonded together or they may be formed largely in an integral manner or in an entirely integral manner with the electrically active components remaining embedded in the mold structure after removal of sacrificial portions of the electrochemically fabricated structure.

Figure 14:
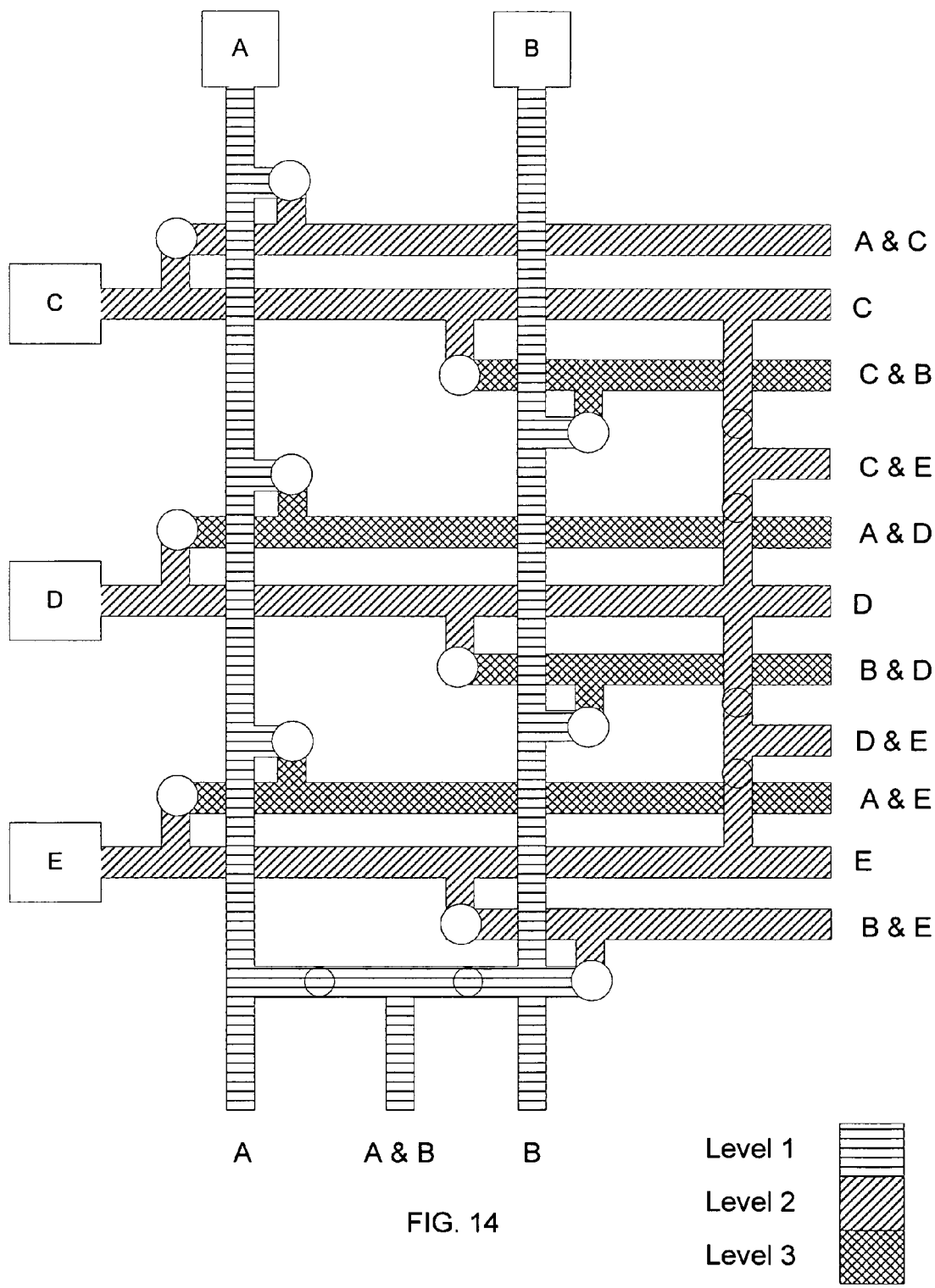
FIG. 14 depicts a schematic illustration of a chemical mixing network that is formed from a combination of pumps, valves, and a series of interconnected flow passages that can be molded using various preferred embodiments of the invention.

FIG. 14 provides a schematic illustration of an example chemical mixing system producible by the molding operations as taught herein. The mixing system includes five pumps A, B, C, D, and E which may be formed from multiple appropriately operated valve-like elements of FIGS. 12C and 13B. Each pump may supply a different material to the mixing system. FIG. 14 also includes numerous valve elements (represented by circles) that may be similar to the valve depicted in FIGS. 12C and 13B or may be a variation thereof. Also depicted are various mixing and output lines. In some preferred embodiments the valves would be one-way check valves. By appropriate control of the pumps and valves, pure materials may be dispensed, or mixtures of various concentrations may be dispensed. The material output from each line is indicated by designation of the pump/material designator. In other alternative embodiments mixing more than two materials is possible and in still further embodiments all outputs may be feed to a reduced number of output channels. Complex structures, even like that of FIG. 14 can be made from moldable materials according to various embodiments of the present invention.

Figure 15A:
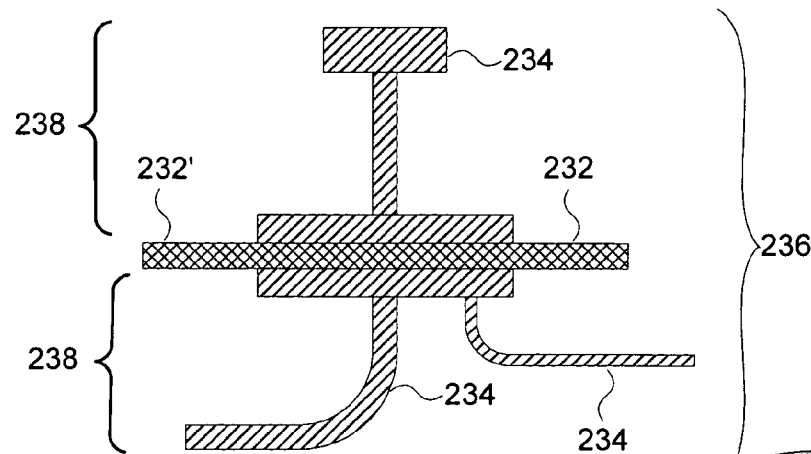
FIGS. 15A-15C depicts the production of a molded article from a mold whose surface configuration is formed at least in part by an electrochemically produced molding structure that includes sacrificial material that is removed from the molded article as well as a structural component that becomes part of the molded structure/device.
Figure 15B:
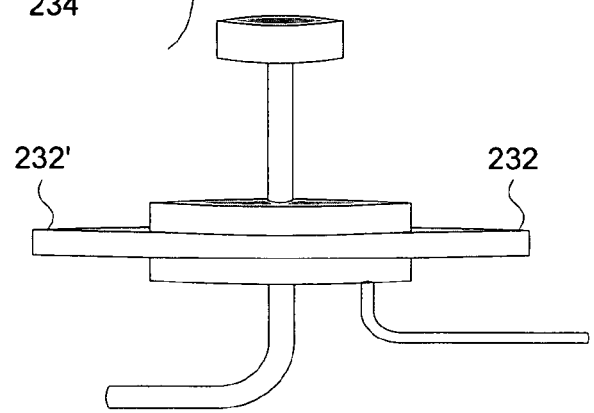
Figure 15C:
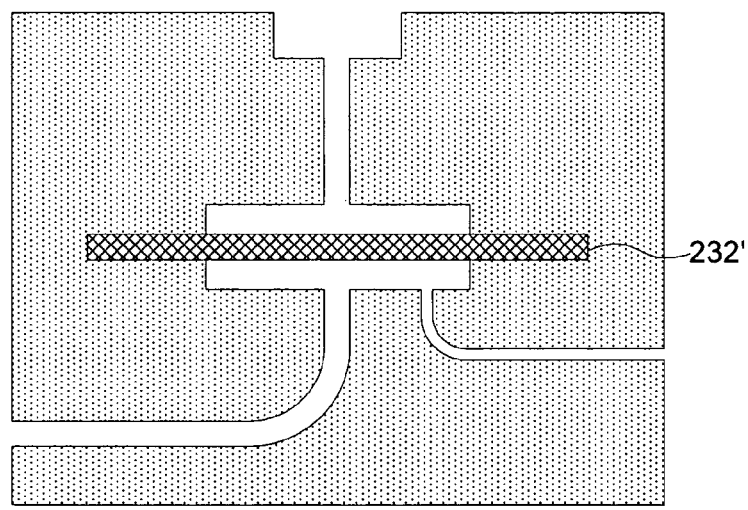

FIGS. 15A-15C depict the production of a molded article from a mold whose surface configuration is formed at least in part by an electrochemically produced molding structure that includes a sacrificial material that is removed from the molded structure as well as a structural material that will become part of the molded structure. FIGS. 15A and 15B depict an electrochemically produced structure 236 that comprises two structural materials 232 and 234. During formation of the structure at least a third material would be used as a temporary support structure (not shown). This temporary support structure would be formed of a sacrificial material which would be removed to reveal the desired three-dimensional structure 236. The first structural material 232 is used to form disc shaped structure 232' while the second structural material 234 is used to form the remainder of the structure 236. The portion 238 of the structure is identical to the structure used as the molding structure for the valve of FIGS. 12C and 13B. Instead of the member 198' of FIG. 12C being formed of molded material, in the present embodiment the member 232' is formed from the first structural material 232 which will remain behind in the molded structure after removal of material 234. Though material 234 was a structural material for structure 238 it is a sacrificial material as far as molding is concerned. By leaving in the electrochemically formed member 232', the resulting molded structure can take on properties other than those possessed by the molding material.

Figure 16A:
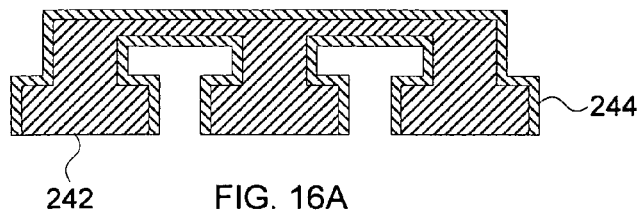
FIGS. 16A-16E depict side views of various stages of the production of a molded article that is formed in a multistep molding process resulting in an article formed from multiple molding materials.
Figure 16B:
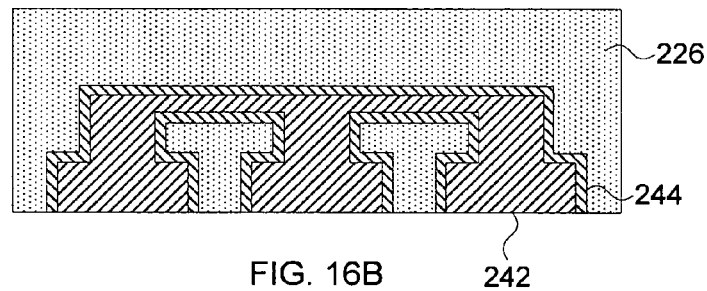
Figure 16C:
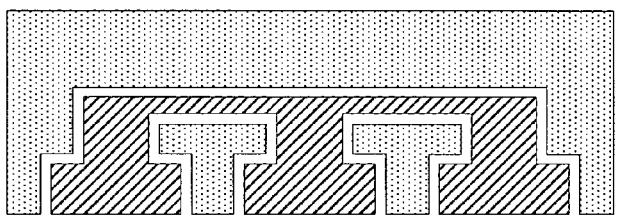
Figure 16D:
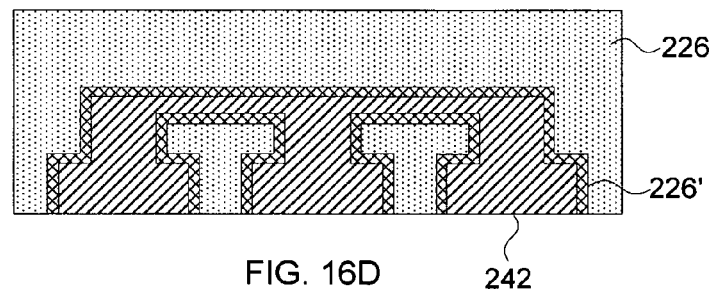
Figure 16E:
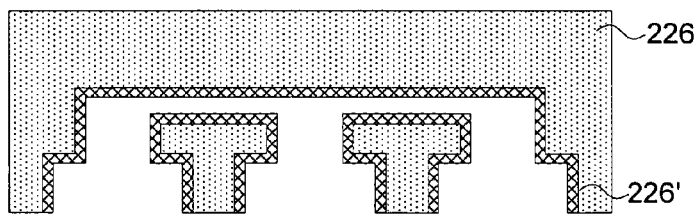

In alternative embodiments, in some circumstances, it may be possible to use a secondary molding material for a structure like 232' (i.e. material 232 and structure 232' would be removed and a secondary molding material and molded structure inserted in their place). Use of a secondary molding material is illustrated in FIGS. 16A-16E. FIG. 16A depicts an electrochemically formed structure that includes a core region of a first structural material 242 and a shell region of a second structural material 244. FIG. 16B depicts the partial surrounding of the composite structure with a molding material 226 (via a primary molding operation). FIG. 16C depicts the structure after solidification of 226 and after removal (e.g. by etching) of the second structural material 244. FIG. 16D depicts the molded structure after a secondary molding operation where a second molding material 226' is made to fill the void left by removal of material 244. Finally, FIG. 16E depicts the final molded structure after removal of the other electrochemically fabricated pattern of structural material 242.

Though the two structures remaining in FIG. 16C are not shown as connected, the orientation of the initially formed mold and the structure formed from second sacrificial material 242 may be maintained by inclusion of contact points between the first formed mold and the second sacrificial material or by inclusion of other fixturing structures that fix the two structures in position by their bases. Such fixturing structures may be removed after the molding of FIG. 16D along with any excess molding material 226' that protrudes from the base of the structure. Thereafter, material 242 may be removed.

In alternative embodiments, both primary and secondary molding operations and the leaving behind of electrochemically fabricated structures are possible. From the teachings herein materials may be both treated as structural materials for one set of operations and then as sacrificial materials for another set of operations. In the electrochemical fabrication processes for the embodiments of the present invention, an initial sacrificial material may be used during the formation of the desired three-dimensional structure. This sacrificial material is removed to reveal the desired structure and then the desired structure is used in molding operations after which a portion or all of its structural material will become a sacrificial material as far as the final desired structure (i.e. the molded structure) is concerned.

Though the techniques of the present invention may be used in many ways, particularly beneficial embodiments of the present invention use the electrochemically produced structures as patterns for flow paths and hollowed out regions in molded material. The hollowed out regions may be used as part of a desired structure or they may be backfilled in whole or in part with secondary materials.

Embodiments of the present invention can be used to produce structures that are entirely integral (i.e. formed from a single operation) as opposed to requiring that they be painstakingly assembled later. Embodiments of particular interest are those which produce molded structures that include small feature sizes (i.e. on the order of microns, or maybe even submicrons, up to a hundred or more microns).

In addition to forming molded articles, the techniques of various preferred embodiments of the present invention may be used to embed EFAB produced structural elements in one or more dielectrics or to fill holes in such structural elements with one or more dielectric materials.

The patent applications set forth below are hereby incorporated by reference herein as if set forth in full. The gist of each patent application is included in the table to aid the reader in finding specific types of teachings. It is not intended that the incorporation of subject matter be limited to those topics specifically indicated, but instead the incorporation is to include all subject matter found in these applications. The teachings in these incorporated applications can be combined with the teachings of the instant application in many ways: For example, enhanced methods of producing structures may be derived from the combination of teachings, enhanced structures may be obtainable, enhanced apparatus may be derived, and the like.

U.S. patent application Ser. No. 09/488,142, filed Jan. 20, 2000, now U.S. Pat. No. 6,572,742, and entitled "An Apparatus for Electrochemical Fabrication Comprising A Conformable Mask" is a divisional of the application that led to the above noted '630 patent. This application describes the basics of conformable contact mask plating and electrochemical fabrication including various alternative methods and apparatus for practicing EFAB as well as various methods and apparatus for constructing conformable contact masks.

U.S. Provisional Application No. 60/415,374, filed on Oct. 1, 2002, and entitled "Monolithic Structures Including Alignment and/or Retention Fixtures for Accepting Components" is generally directed to permanent or temporary alignment and/or retention structures for receiving multiple components. The structures are preferably formed monolithically via a plurality of deposition operations (e.g. electrodeposition operations). The structures typically include two or more positioning fixtures that control or aid in the positioning of components relative to one another, such features may include (1) positioning guides or stops that fix or at least partially limit the positioning of components in one or more orientations or directions, (2) retention elements that hold positioned components in desired orientations or locations, and (3) positioning and/or retention elements that receive and hold adjustment modules into which components can be fixed and which in turn can be used for fine adjustments of position and/or orientation of the components.

U.S. Provisional Application No. 60/464,504, filed on Apr. 21, 2003, and entitled "Methods of Reducing Discontinuities Between Layers of Electrochemically Fabricated Structures" is generally directed to various embodiments providing electrochemical fabrication methods and apparatus for the production of three-dimensional structures from a plurality of adhered layers of material including operations or structures for reducing discontinuities in the transitions between adjacent layers. Some embodiments improve the conformance between a size of produced structures (especially in the transition regions associated with layers having offset edges) and the intended size of the structure as derived from original data representing the three-dimensional structures. Some embodiments make use of selective and/or blanket chemical and/or electrochemical deposition processes, selective and or blanket chemical and/or electrochemical etching process, or combinations thereof. Some embodiments make use of multi-step deposition or etching operations during the formation of single layers.

U.S. Provisional Application No. 60/468,979, filed on May 7, 2003, and entitled "EFAB With Selective Transfer Via Instant Mask" is generally directed to three-dimensional structures that are electrochemically fabricated by depositing a first material onto previously deposited material through voids in a patterned mask where the patterned mask is at least temporarily adhered to a substrate or previously formed layer of material and is formed and patterned onto the substrate via a transfer tool patterned to enable transfer of a desired pattern of precursor masking material. In some embodiments the precursor material is transformed into masking material after transfer to the substrate while in other embodiments the precursor is transformed during or before transfer. In some embodiments layers are formed one on top of another to build up multi-layer structures. In some embodiments the mask material acts as a build material while in other embodiments the mask material is replaced each layer by a different material which may, for example, be conductive or dielectric.

U.S. Provisional Application No. 60/469,053, filed on May 7, 2003, and entitled "Three-Dimensional Object Formation Via Selective Inkjet Printing & Electrodeposition" is generally directed to three-dimensional structures that are electrochemically fabricated by depositing a first material onto previously deposited material through voids in a patterned mask where the patterned mask is at least temporarily adhered to previously deposited material and is formed and patterned directly from material selectively dispensed from a computer controlled dispensing device (e.g. an ink jet nozzle or array or an extrusion device). In some embodiments layers are formed one on top of another to build up multi-layer structures. In some embodiments the mask material acts as a build material while in other embodiments the mask material is replaced each layer by a different material which may, for example, be conductive or dielectric.

U.S. patent application Ser. No. 10/271,574, filed on Oct. 15, 2002, and entitled "Methods of and Apparatus for Making High Aspect Ratio Microelectromechanical Structures" is generally directed to various embodiments for forming structures (e.g. HARMS-type structures) via an electrochemical extrusion (ELEX™) process. Preferred embodiments perform the extrusion processes via depositions through anodeless conformable contact masks that are initially pressed against substrates that are then progressively pulled away or separated as the depositions thickens. A pattern of deposition may vary over the course of deposition by including more complex relative motion between the mask and the substrate elements. Such complex motion may include rotational components or translational motions having components that are not parallel to an axis of separation. More complex structures may be formed by combining the ELEX™ process with the selective deposition, blanket deposition, planarization, etching, and multi-layer operations of EFAB™.

U.S. Provisional Application No. 60/435,324, filed on Dec. 20, 2002, and entitled "EFAB Methods and Apparatus Including Spray Metal or Powder Coating Processes", is generally directed to techniques for forming structures via a combined electrochemical fabrication process and a thermal spraying process. In a first set of embodiments, selective deposition occurs via conformable contact masking processes and thermal spraying is used in blanket deposition processes to fill in voids left by selective deposition processes. In a second set of embodiments, selective deposition via a conformable contact masking is used to lay down a first material in a pattern that is similar to a net pattern that is to be occupied by a sprayed metal. In these embodiments a second material is blanket deposited to fill in the voids left in the first pattern, the two depositions are planarized to a common level that may be somewhat greater than a desired layer thickness, the first material is removed (e.g. by etching), and a third material is sprayed into the voids left by the etching operation. The resulting depositions in both the first and second sets of embodiments are planarized to a desired layer thickness in preparation for adding additional layers to form three-dimensional structures from a plurality of adhered layers. In other embodiments, additional materials may be used and different processes may be used.

U.S. Provisional Application No. 60/429,483, filed on Nov. 26, 2002, and entitled "Multi-cell Masks and Methods and Apparatus for Using Such Masks to Form Three-Dimensional Structures" is generally directed to multi-layer structures that are electrochemically fabricated via depositions of one or more materials in a plurality of overlaying and adhered layers. Selectivity of deposition is obtained via a multi-cell controllable mask. Alternatively, net selective deposition is obtained via a blanket deposition and a selective removal of material via a multi-cell mask. Individual cells of the mask may contain electrodes comprising depositable material or electrodes capable of receiving etched material from a substrate. Alternatively, individual cells may include passages that allow or inhibit ion flow between a substrate and an external electrode and that include electrodes or other control elements that can be used to selectively allow or inhibit ion flow and thus inhibiting significant deposition or etching.

U.S. Provisional Application No. 60/429,484, filed on Nov. 26, 2002, and entitled "Non-Conformable Masks and Methods and Apparatus for Forming Three-Dimensional Structures" is generally directed to electrochemical fabrication used to form multi-layer structures (e.g. devices) from a plurality of overlaying and adhered layers. Masks, that are independent of a substrate to be operated on, are generally used to achieve selective patterning. These masks may allow selective deposition of material onto the substrate or they may allow selective etching of a substrate whereafter the created voids may be filled with a selected material that may be planarized to yield in effect a selective deposition of the selected material. The mask may be used in a contact mode or in a proximity mode. In the contact mode the mask and substrate physically mate to form substantially independent process pockets. In the proximity mode, the mask and substrate are positioned sufficiently close to allow formation of reasonably independent process pockets. In some embodiments, masks may have conformable contact surfaces (i.e. surfaces with sufficient deformability that they can substantially conform to surface of the substrate to form a seal with it) or they may have semi-rigid or even rigid surfaces. Post deposition etching operations may be performed to remove flash deposits (thin undesired deposits).

U.S. patent application Ser. No. 10/309,521, filed on Dec. 3, 2002, and entitled "Miniature RF and Microwave Components and Methods for Fabricating Such Components" is generally directed to RF and microwave radiation directing or controlling components that may be monolithic, that may be formed from a plurality of electrodeposition operations and/or from a plurality of deposited layers of material, that may include switches, inductors, antennae, transmission lines, filters, and/or other active or passive components. Components may include non-radiation-entry and non-radiation-exit channels that are useful in separating sacrificial materials from structural materials. Preferred formation processes use electrochemical fabrication techniques (e.g. including selective depositions, bulk depositions, etching operations and planarization operations) and post-deposition processes (e.g. selective etching operations and/or back filling operations).

U.S. Provisional Application No. 60/468,977, filed on May 7, 2003, and entitled "Method for Fabricating Three-Dimensional Structures Including Surface Treatment of a First Material in Preparation for Deposition of a Second Material" is generally directed to a method of fabricating three-dimensional structures from a plurality of adhered layers of at least a first and a second material wherein the first material is a conductive material and wherein each of a plurality of layers includes treating a surface of a first material prior to deposition of the second material. The treatment of the surface of the first material either (1) decreases the susceptibility of deposition of the second material onto the surface of the first material or (2) eases or quickens the removal of any second material deposited on the treated surface of the first material. In some embodiments the treatment of the first surface includes forming a dielectric coating over the surface while the deposition of the second material occurs by an electrodeposition process (e.g. an electroplating or electrophoretic process).

U.S. patent application Ser. No. 10/387,958, filed on Mar. 13, 2003, and entitled "Electrochemical Fabrication Method and Apparatus for Producing Three-Dimensional Structures Having Improved Surface Finish" is generally directed to an electrochemical fabrication process that produces three-dimensional structures (e.g. components or devices) from a plurality of layers of deposited materials wherein the formation of at least some portions of some layers are produced by operations that remove material or condition selected surfaces of a deposited material. In some embodiments, removal or conditioning operations are varied between layers or between different portions of a layer such that different surface qualities are obtained. In other embodiments varying surface quality may be obtained without varying removal or conditioning operations but instead by relying on differential interaction between removal or conditioning operations and different materials encountered by these operations.

U.S. patent application Ser. No. 10/434,494, filed on May 7, 2003, and entitled "Methods and Apparatus for Monitoring Deposition Quality During Conformable Contact Mask Plating Operations" is generally directed to a electrochemical fabrication (e.g. EFAB) processes and apparatus are disclosed that provide monitoring of at least one electrical parameter (e.g. voltage) during selective deposition where the monitored parameter is used to help determine the quality of the deposition that was made. If the monitored parameter indicates that a problem occurred with the deposition, various remedial operations may be undertaken to allow successful formation of the structure to be completed.

U.S. patent application Ser. No. 10/434,289, filed on May 7, 2003, and entitled "Conformable Contact Masking Methods and Apparatus Utilizing In Situ Cathodic Activation of a Substrate" is generally directed to a electroplating processes (e.g. conformable contact mask plating and electrochemical fabrication processes) that includes in situ activation of a surface onto which a deposit will be made. At least one material to be deposited has an effective deposition voltage that is higher than an open circuit voltage, and wherein a deposition control parameter is capable of being set to such a value that a voltage can be controlled to a value between the effective deposition voltage and the open circuit voltage such that no significant deposition occurs but such that surface activation of at least a portion of the substrate can occur. After making electrical contact between an anode, that comprises the at least one material, and the substrate via a plating solution, applying a voltage or current to activate the surface without any significant deposition occurring, and thereafter without breaking the electrical contact, causing deposition to occur.

U.S. patent application Ser. No. 10/434,294, filed on May 7, 2003, and entitled "Electrochemical Fabrication Methods With Enhanced Post Deposition Processing" is generally directed to a electrochemical fabrication process for producing three-dimensional structures from a plurality of adhered layers is provided where each layer comprises at least one structural material (e.g. nickel) and at least one sacrificial material (e.g. copper) that will be etched away from the structural material after the formation of all layers have been completed. A copper etchant containing chlorite (e.g. Enthone C-38) is combined with a corrosion inhibitor (e.g. sodium nitrate) to prevent pitting of the structural material during removal of the sacrificial material. A simple process for drying the etched structure without the drying process causing surfaces to stick together includes immersion of the structure in water after etching and then immersion in alcohol and then placing the structure in an oven for drying.

U.S. patent application Ser. No. 10/434,295, filed on May 7, 2003, and entitled "Method of and Apparatus for Forming Three-Dimensional Structures Integral With Semiconductor Based Circuitry" is generally directed to enhanced electrochemical fabrication processes that can form three-dimensional multi-layer structures using semiconductor based circuitry as a substrate. Electrically functional portions of the structure are formed from structural material (e.g. nickel) that adheres to contact pads of the circuit. Aluminum contact pads and silicon structures are protected from copper diffusion damage by application of appropriate barrier layers. In some embodiments, nickel is applied to the aluminum contact pads via solder bump formation techniques using electroless nickel plating. In other embodiments, selective electroless copper plating or direct metallization is used to plate sacrificial material directly onto dielectric passivation layers. In still other embodiments, structural material deposition locations are shielded, then sacrificial material is deposited, the shielding is removed, and then structural material is deposited.

U.S. patent application Ser. No. 10/434,493, filed on May 7, 2003, and entitled "Electrochemically Fabricated Structures Having Dielectric or Active Bases and Methods of and Apparatus for Producing Such Structures" is generally directed to multi-layer structures that are electrochemically fabricated on a temporary (e.g. conductive) substrate and are thereafter bonded to a permanent (e.g. dielectric, patterned, multi-material, or otherwise functional) substrate and removed from the temporary substrate. In some embodiments, the structures are formed from top layer to bottom layer, such that the bottom layer of the structure becomes adhered to the permanent substrate, while in other embodiments the structures are form from bottom layer to top layer and then a double substrate swap occurs. The permanent substrate may be a solid that is bonded (e.g. by an adhesive) to the layered structure or it may start out as a flowable material that is solidified adjacent to or partially surrounding a portion of the structure with bonding occurs during solidification. The multi-layer structure may be released from a sacrificial material prior to attaching the permanent substrate or it may be released after attachment.

U.S. patent application Ser. No. 10/434,103, filed on May 7, 2003 now U.S. Pat. No. 7,160,429, and entitled "Electrochemically Fabricated Hermetically Sealed Microstructures and Methods of and Apparatus for Producing Such Structures" is generally directed to multi-layer structures that are electrochemically fabricated from at least one structural material (e.g. nickel), at least one sacrificial material (e.g. copper), and at least one sealing material (e.g. solder). In some embodiments, the layered structure is made to have a desired configuration which is at least partially and immediately surrounded by sacrificial material which is in turn surrounded almost entirely by structural material. The surrounding structural material includes openings in the surface through which etchant can attack and remove trapped sacrificial material found within. Sealing material is located near the openings. After removal of the sacrificial material, the box is evacuated or filled with a desired gas or liquid. Thereafter, the sealing material is made to flow, seal the openings, and resolidify. In other embodiments, a post-layer formation lid or other enclosure completing structure is added.

U.S. patent application Ser. No. 10/434,497, filed on May 7, 2003, and entitled "Multistep Release Method for Electrochemically Fabricated Structures" is generally directed to multi-layer structures that are electrochemically fabricated from at least one structural material (e.g. nickel), that is configured to define a desired structure and which may be attached to a substrate, and from at least one sacrificial material (e.g. copper) that surrounds the desired structure. After structure formation, the sacrificial material is removed by a multi-stage etching operation. In some embodiments sacrificial material to be removed may be located within passages or the like on a substrate or within an add-on component. The multi-stage etching operations may be separated by intermediate post processing activities, they may be separated by cleaning operations, or barrier material removal operations, or the like. Barriers may be fixed in position by contact with structural material or with a substrate or they may be solely fixed in position by sacrificial material and are thus free to be removed after all retaining sacrificial material is etched.

U.S. patent application Ser. No. 10/434,519, filed on May 7, 2003, and entitled "Methods of and Apparatus for Electrochemically Fabricating Structures Via Interlaced Layers or Via Selective Etching and Filling of Voids" is generally directed to multi-layer structures that are electrochemically fabricated by depositing a first material, selectively etching the first material (e.g. via a mask), depositing a second material to fill in the voids created by the etching, and then planarizing the depositions so as to bound the layer being created and thereafter adding additional layers to previously formed layers. The first and second depositions may be of the blanket or selective type. The repetition of the formation process for forming successive layers may be repeated with or without variations (e.g. variations in: patterns; numbers or existence of or parameters associated with depositions, etchings, and or planarization operations; the order of operations, or the materials deposited). Other embodiments form multi-layer structures using operations that interlace material deposited in association with some layers with material deposited in association with other layers.

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may involve the selective deposition of a plurality of different materials on a single layer or on different layers. Some embodiments may use blanket depositions processes that are not electrodeposition processes. Some embodiments may use selective deposition processes on some layers that are not conformable contact masking processes and are not even electrodeposition processes. Some embodiments may use nickel as a structural material while other embodiments may use different materials such as gold, silver, or any other electrodepositable materials that can be separated from the copper and/or some other sacrificial material. Some embodiments may use copper as the structural material with or without a sacrificial material. Some embodiments may remove a sacrificial material while other embodiments may not. In some embodiments, the depth of deposition will be enhanced by pulling the conformable contact mask away from the substrate as deposition is occurring in a manner that allows the seal between the conformable portion of the CC mask and the substrate to shift from the face of the conformal material to the inside edges of the conformable material.

In view of the teachings herein, many further embodiments, alternatives in design and uses of the invention will be apparent to those of skill in the art. As such, it is not intended that the invention be limited to the particular illustrative embodiments, alternatives, and uses described above but instead that it be solely limited by the claims presented hereafter.

I claim:

1. A method of forming a three-dimensional molded structure, comprising:
    (A) providing a mold having a mold structure that comprises at least one sacrificial material and at least one structural material, the at least one sacrificial material and the at least one structural material each have a surface that define a portion of a desired molding pattern, wherein the mold structure is formed, at least in part, by electrochemically depositing multiple layers, each comprising the at least one sacrificial material deposited adjacent to and adhered to a previously deposited layer that comprises the at least one sacrificial material and wherein the at least one structural material is electrochemically deposited during formation of at least one layer;
    (B) placing flowable molding material against the desired molding pattern and allowing or causing the molding material to solidify to form at least a portion of the three-dimensional molded structure; and
    (C) separating the three-dimensional molded structure from a portion of the mold, wherein the separating is accomplished, at least in part, by destroying the desired molding pattern defined by the at least one sacrificial material without significantly damaging the molding material such that an image of the molding pattern remains on a surface of the three-dimensional molded structure, and wherein the at least one structural material, after destroying the desired molding pattern, is restrained to a desired location by the molding material and becomes part of the three-dimensional structure.

* * * * *